United States Patent
Yamada et al.

(10) Patent No.: US 9,654,082 B2
(45) Date of Patent: May 16, 2017

(54) VIBRATOR, OSCILLATOR, ELECTRONIC DEVICE FOR CONTROLLING INTERNAL RESONANCE BETWEEN INHERENT VIBRATION MODES

(71) Applicant: SEIKO EPSON CORPORATION, Tokyo (JP)

(72) Inventors: Akinori Yamada, Ina (JP); Shuhei Yoshida, Minowa-machi (JP); Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/136,157

(22) Filed: Apr. 22, 2016

(65) Prior Publication Data

US 2016/0322935 A1     Nov. 3, 2016

(30) Foreign Application Priority Data

Apr. 28, 2015   (JP) ................................. 2015-091592
Nov. 30, 2015   (JP) ................................. 2015-233769

(51) Int. Cl.
*H03B 5/30* (2006.01)
*H03H 9/19* (2006.01)
(Continued)

(52) U.S. Cl.
CPC ............. *H03H 9/19* (2013.01); *G01L 1/106* (2013.01); *H03B 5/32* (2013.01); *H03H 9/0547* (2013.01); *H03H 9/21* (2013.01); *H03H 9/215* (2013.01)

(58) Field of Classification Search
CPC .......... H03H 9/21; H03H 9/0547; H03H 9/19; H03H 9/215; H03B 5/32; G01L 1/106
(Continued)

(56) References Cited

U.S. PATENT DOCUMENTS 4,372,173 A    2/1983   EerNisse et al.
5,668,329 A    9/1997   Petri
(Continued)

FOREIGN PATENT DOCUMENTS

JP    H02-30449 B2    7/1990
JP    2002-141770 A   5/2002
(Continued)

OTHER PUBLICATIONS

Nayfeh, "Nonlinear Interactions Analytical, Computational, and Experimental Methods," Wiley Series in Nonlinear Science, pp. 12-13.

*Primary Examiner* — Arnold Kinkead
(74) *Attorney, Agent, or Firm* — Oliff PLC

(57) ABSTRACT

A vibrator includes a vibrator element and a base on which the vibrator element is installed. In addition, when n is set to a natural number equal to or greater than 2, and j is set to a natural number equal to or greater than 1 and equal to or less than n, the vibrator element includes n inherent vibration modes having resonance frequencies different from each other, and when a resonance frequency of a main vibration of the vibrator element in the n inherent vibration modes is set to $\omega_1$ in a relationship between an arbitrary integer $k_j$ and a resonance frequency $\omega_j$ corresponding to each of the n inherent vibration modes, the following three expressions are all satisfied.

$$\Delta\omega \equiv \left( \frac{\sum_{j=2}^{n} k_j \omega_j}{-k_1} - \omega_1 \right) / \omega_1$$

$$|\omega_1| \geq 0.1$$

$$3 \leq \sum_{j=1}^{n} |k_j| \leq 10$$

13 Claims, 20 Drawing Sheets

(51) Int. Cl.
 *G01L 1/10* (2006.01)
 *H03B 5/32* (2006.01)
 *H03H 9/21* (2006.01)
 *H03H 9/05* (2006.01)
 *H03H 9/215* (2006.01)

(58) Field of Classification Search
 USPC .............. 310/370; 331/154, 156; 73/504.16, 73/504.12
 See application file for complete search history.

(56) References Cited

U.S. PATENT DOCUMENTS

| | | |
|---|---|---|
| 6,587,009 B2 | 7/2003 | Kitamura et al. |
| 2013/0019681 A1* | 1/2013 | Shimura ............ G01C 19/5607 73/504.16 |
| 2014/0292433 A1 | 10/2014 | Yamada et al. |

FOREIGN PATENT DOCUMENTS

| | | |
|---|---|---|
| JP | 2002-261575 A | 9/2002 |
| JP | 2005-197946 A | 7/2005 |
| JP | 2005-236563 A | 9/2005 |
| JP | 3885893 B2 | 2/2007 |
| JP | 2015-087263 A | 5/2015 |
| JP | 2015-149592 A | 8/2015 |
| WO | 95/31859 A1 | 11/1995 |

* cited by examiner

VIBRATOR, OSCILLATOR, ELECTRONIC DEVICE FOR CONTROLLING INTERNAL RESONANCE BETWEEN INHERENT VIBRATION MODES

BACKGROUND

1. Technical Field

The present invention relates to a vibrator, an oscillator, a real-time clock, an electronic device and a moving object.

2. Related Art

Hitherto, a tuning fork type vibration element using a quartz crystal has been known. Such a vibration element includes a base portion and a pair of vibrating arms, and is configured to flexurally vibrate using a flexural reverse-phase mode (hereinafter, referred to as an X-axis reverse-phase mode) in which the pair of vibrating arms alternately repeat approach and separation to and from each other, when seen in plan view, as a main vibration. In addition, in the field of such a vibration element, various configurations for reducing the vibration leakage (loss of elastic energy leaking outside of the vibration element) of the main vibration have been disclosed. For example, JP-A-2002-261575 discloses that the vibration leakage of the main vibration is reduced by forming notches on both sides of the base portion. In addition, JP-A-2005-236563 discloses that the vibration leakage of the main vibration is reduced by lengthening a transmission path of the main vibration with the base portion formed in a frame shape, and providing the base portion with a vibration offset portion that cancels the main vibration. In addition, JP-A-2002-141770 discloses that the vibration leakage of the main vibration is reduced by providing a support portion extending out from the base portion and supporting the vibration element through the support portion, to thereby lengthen a transmission path of the main vibration. In addition, JP-A-2015-149592 discloses that since coupling between modes is strengthened in a case where the resonance frequency of the main vibration and the resonance frequency of inherent modes (unnecessary vibration modes) other than the main vibration are close to 1:1, the vibration leakage of the main vibration is reduced by weakening this coupling.

As described above, various inventions for reducing the vibration leakage have been disclosed, but all of the inventions are inventions for reducing the vibration leakage of a flexural vibration (main vibration itself) in a pure X-axis reverse-phase mode, or inventions relating to coupling in which the resonance frequencies of the main vibration and the unnecessary vibration are set to be in the vicinity of 1:1 due to the number of unnecessary vibration modes being limited to one. Such inventions do not disclose internal resonance with inherent modes (unnecessary vibration modes) other than the main vibration, particularly, the vibration leakage of the main vibration caused by a plurality of unnecessary vibration modes, and the vibration leakage of the main vibration caused by internal resonance except in the vicinity of a condition in which a resonance frequency ratio with respect to a singular unnecessary vibration mode is set to 1.

SUMMARY

An advantage of some aspects of the invention is to provide a vibrator, an oscillator, a real-time clock, an electronic device and a moving object which are capable of internal resonance of an unnecessary vibration mode with a main vibration, and reducing the leakage of energy of the main vibration through the unnecessary vibration mode.

The invention can be implemented as the following application examples.

A vibrator according to this application example includes: a vibrator element including a base portion and a pair of vibrating arms which are coupled to the base portion; and a base on which the vibrator element is installed, wherein when n is set to one of natural numbers equal to or greater than 2, and j is set to a natural number equal to or greater than 1 and equal to or less than n, the vibrator element includes the n inherent vibration modes having resonance frequencies different from each other, when a resonance frequency of a main vibration of the vibrator element in the n inherent vibration modes is set to $\omega_1$ in a relationship between an arbitrary integer $k_j$ and a resonance frequency $\omega_j$ corresponding to each of the n inherent vibration modes, the following two expressions are satisfied:

$$\Delta\omega \equiv \left( \frac{\sum_{j=2}^{n} k_j \omega_j}{-k_1} - \omega_1 \right) \Big/ \omega_1 \text{ and } |\omega_1| \geq 0.1,$$

the arbitrary integer $k_j$ satisfies a relation between the following two expressions.

$$3 \leq \sum_{j=1}^{n} |k_j| \leq 10$$

$$n \leq \sum_{j=1}^{n} |k_j|$$

With this configuration, the vibrator is obtained which is capable of reducing the vibration leakage of the main vibration caused by internal resonance with inherent modes other than the main vibration.

In the vibrator according to the application example, it is preferable that when the vibration frequency of the main vibration is set to f [Hz], a relation of $1\times10^3$ [Hz]$\leq f < 1\times10^6$ [Hz] is satisfied, and Q of the vibrator satisfies a relation of the following expression.

$$Q \geq \frac{\rho C_p}{c\alpha^2 \Theta} \times \frac{1 + \left(\frac{f}{f0_{max}}\right)^2}{\frac{f}{f0_{max}}}$$

In the expression, $$f0_{max} = \frac{\pi k}{2\rho C_p W_{emin}^2}$$

$W_{emin} = C(AL+B)$
$A = 7.3690 \times 10^{-2}$
$B = 1.2544 \times 10^{-5}$
$C = 1.1$ to $1.3$
$L$ [m] is a length of the vibrating arm in an extending direction
$\rho$ [kg/m$^3$] is a mass density of the vibrating arm, Cp [J/(kg·K)] is a heat capacity of the vibrating arm
c [N/m²] is an elastic constant of the vibrating arm in the extending direction
α [1/K] is a coefficient of thermal expansion of the vibrating arm in the extending direction
Θ [K] is an environmental temperature
k [W/(m·k)] is a thermal conductivity of the vibrating arm in a width direction
π is a ratio of the circumference of a circle to its diameter With this configuration, a vibrator element is obtained which is small in size and has a high Q value.

In the vibrator according to the application example, it is preferable that a relation of the following expression is satisfied.

$$3 \le \sum_{j=1}^{n} |k_j| \le 6$$

With this configuration, coupling between the main vibration and other inherent modes is not likely to occur even in a vibrator element in which low-order non-linearity appears conspicuously, and it is possible to reduce vibration leakage.

In the vibrator according to the application example, it is preferable that a relation of the following expression is satisfied.

$$3 \le \sum_{j=1}^{n} |k_j| \le 4$$

With this configuration, coupling between the main vibration and other inherent modes is not likely to occur even in a vibrator element in which low-order non-linearity appears conspicuously, and it is possible to reduce vibration leakage.

In the vibrator according to the application example, it is preferable that the inherent mode includes at least two of: a first direction reverse-phase mode in which the pair of vibrating arms flexurally vibrate mutually in reverse-phase along a first direction in which the pair of vibrating arms are lined up; a first direction in-phase mode in which the pair of vibrating arms flexurally vibrate mutually in phase along the first direction; a third direction reverse-phase mode in which the pair of vibrating arms flexurally vibrate mutually in reverse-phase in a second direction in which the base portion and the vibrating arms are lined up, and a third direction perpendicular to the first direction; a third direction in-phase mode in which the pair of vibrating arms flexurally vibrate mutually in phase in the third direction; a twisted reverse-phase mode in which the pair of vibrating arms are twisted mutually in reverse-phase, using a virtual central line along the first direction through a center of a cross section along each vibrating arm in the first direction and the third direction as an axis of rotation; a twisted in-phase mode in which the pair of vibrating arms are twisted mutually in phase, using the virtual central line as an axis of rotation; and a high-order mode of a second direction reverse-phase mode, a high-order mode of a second direction in-phase mode, a high-order mode of the third direction reverse-phase mode, a high-order mode of the third direction in-phase mode, a high-order mode of the twisted reverse-phase mode and a high-order mode of the twisted in-phase mode.

With this configuration, since the vibration of regions other than the vibrating arm is reduced, a vibrator having small vibration leakage is obtained.

In the vibrator according to the application example, it is preferable that the order of each high-order mode of the twisted in-phase mode, the first direction reverse-phase mode, the first direction in-phase mode, the third direction reverse-phase mode, the third direction in-phase mode, the twisted reverse-phase mode and the twisted in-phase mode is a second order.

The high-order mode has a greater influence on the main vibration as the order becomes smaller, and thus the effect of the invention further increases.

In the vibrator according to the application example, it is preferable that the main vibration is the first direction reverse-phase mode.

With this configuration, a vibrator is obtained which is capable of realizing a high Q value and has a small CI value.

In the vibrator according to the application example, it is preferable that the high-order mode includes at least one of second-order modes of the first direction reverse-phase mode, the first direction in-phase mode, the third direction reverse-phase mode, and the third direction in-phase mode.

Such an inherent mode is a vibration which has a low resonance frequency among high-order modes, and particularly has a tendency to be coupled to the main vibration (first direction reverse-phase mode). Therefore, the effect of the invention further increases.

In the vibrator according to the application example, it is preferable that when seen in plan view, the vibrating arm includes: a weight portion; and an arm which is disposed between the weight portion and the base portion, when a length of the arm along a direction in which the base portion and the vibrating arm are lined up is set to L, a relation of L≤0.9 mm is satisfied, when a thickness of the arm is set to T, the relation of 50 µm≤T≤150 µm is satisfied, when a width of the arm along a direction in which the pair of vibrating arms are lined up is set to W, a relation of W≤60 µm is satisfied, when a length of the weight portion along the direction in which the base portion and the vibrating arm are lined up is set to L', a relation of L'/L≤0.5 is satisfied, and when a width of the weight portion along the direction in which the pair of vibrating arms are lined up is set to W", a relation of L'<W" is satisfied.

With this configuration, a vibrator element is obtained which is relatively small in size, and there is a tendency for non-linearity to increase due to symmetry being lost from the shape of the vibrator element.

In the vibrator according to the application example, it is preferable that the vibrating arm is provided with a groove portion on at least one main surface side of a first main surface and a second main surface which have a front-back relationship with each other along a plane including a direction in which the pair of vibrating arms are lined up and a direction in which the base portion and the vibrating arm are lined up, and when a depth of the groove portion is set to T', a relation of 0.8 T≤T'≤0.98 T is satisfied.

With this configuration, it is possible to reduce a thermoelastic loss, and to improve a Q value.

In the vibrator according to the application example, it is preferable that when a width of a portion, along the direction in which the pair of vibrating arms are lined up, which is located between the groove portion and an outer edge of the one main surface of the vibrating arm along the second direction is set to W' when seen in plan view, the relation of W'≤6 µm is satisfied.

With this configuration, it becomes difficult to symmetrically form the vibrating arm.

In the vibrator according to the application example, it is preferable that the length L is equal to or less than $1,800 \times 10^{-6}$ [m].

With this configuration, it is possible to achieve a reduction in the size of the vibrator.

In the vibrator according to the application example, it is preferable that the length L is equal to or less than $1,400 \times 10^{-6}$ [m].

With this configuration, it is possible to achieve a reduction in the size of the vibrator.

In the vibrator according to the application example, it is preferable that the length L is equal to or less than $1,000 \times 10^{-6}$ [m].

With this configuration, it is possible to achieve a reduction in the size of the vibrator.

In the vibrator according to the application example, it is preferable that the length L is equal to or less than $800 \times 10^{6}$ [m].

With this configuration, it is possible to achieve a reduction in the size of the vibrator.

In the vibrator according to the application example, it is preferable that the vibration frequency f is any of two times, four times, eight times and sixteen times $32.768 \pm 1$ kHz.

With this configuration, it is possible to relatively easily obtain a signal of 32.768 kHz by frequency dividing.

In the vibrator according to the application example, it is preferable that the natural number n is any of 2, 3, and 4.

Even in a case where non-linearity is not expressed greater as the natural number n becomes smaller, the main vibration and inherent modes other than the main vibration have a tendency to be coupled to each other, and thus the effect of the invention becomes more conspicuous.

An oscillator according to this application example includes the vibrator according to the application example; and an oscillation circuit.

With this configuration, an oscillator having high reliability is obtained.

A real-time clock according to this application example includes the vibrator according to the application example.

With this configuration, a real-time clock having high reliability is obtained.

An electronic device according to this application example includes the vibrator according to the application example.

With this configuration, an electronic device having high reliability is obtained.

A moving object according to this application example includes the vibrator according to the application example.

With this configuration, a moving object having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a vibrator, an oscillator, a real-time clock, an electronic device and a moving object according to the invention will be described in detail on the basis of preferred embodiments shown in the accompanying drawings.

First Embodiment

First, a vibrator according to a first embodiment of the invention will be described.

Figure 1:
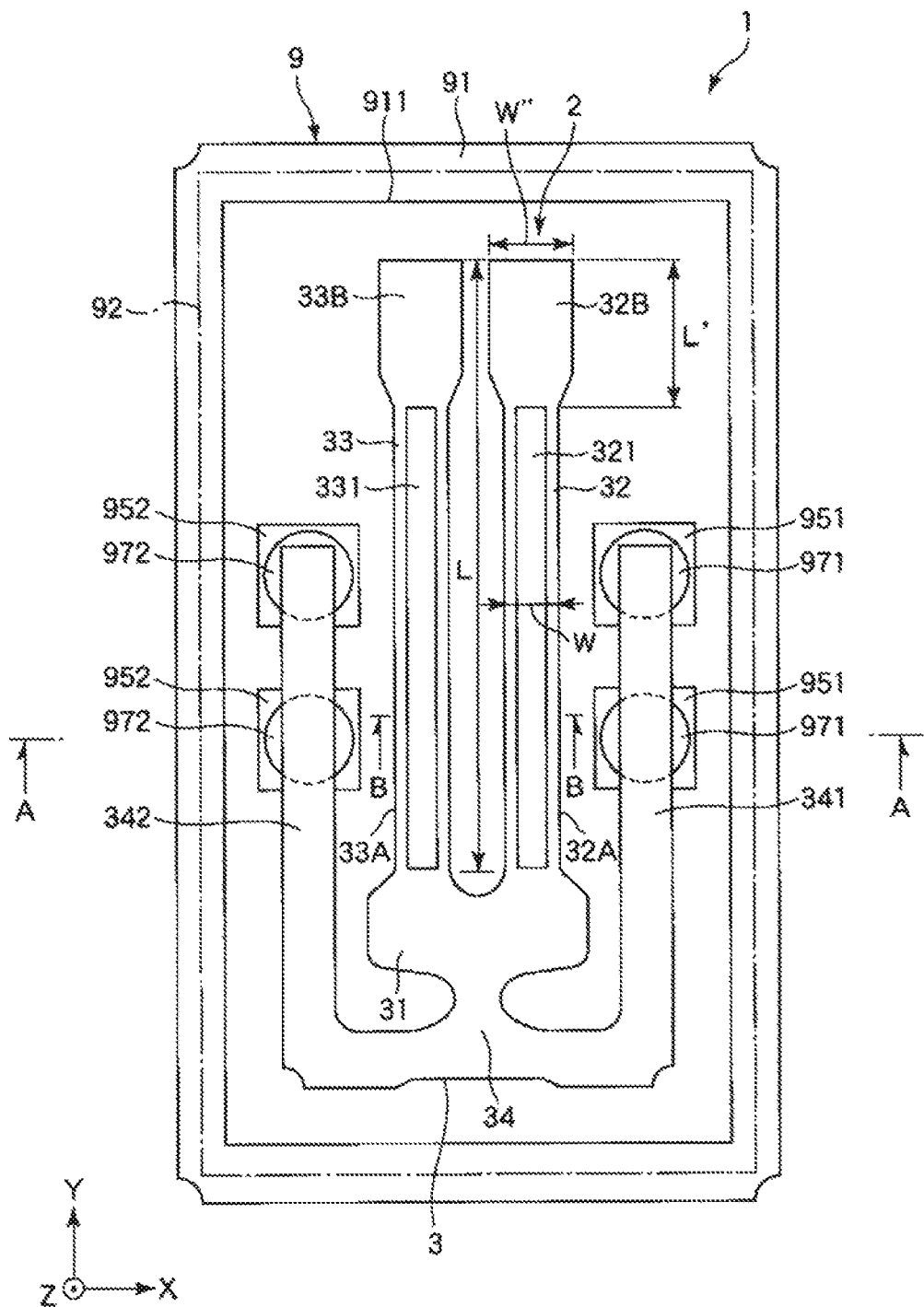
FIG. 1 is a plan view illustrating a vibrator according to a first embodiment of the invention.
Figure 2:
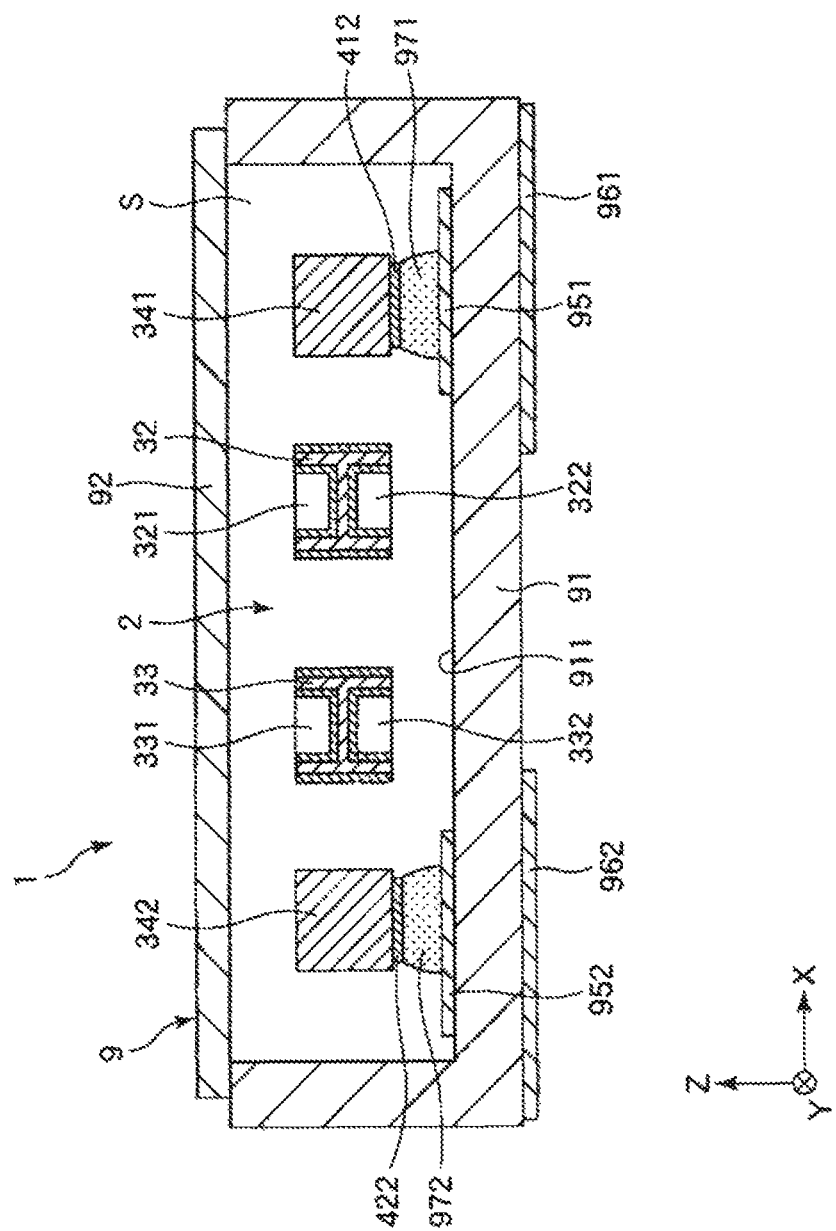
FIG. 2 is a cross-sectional view taken along line A-A of FIG. 1.
Figure 3:
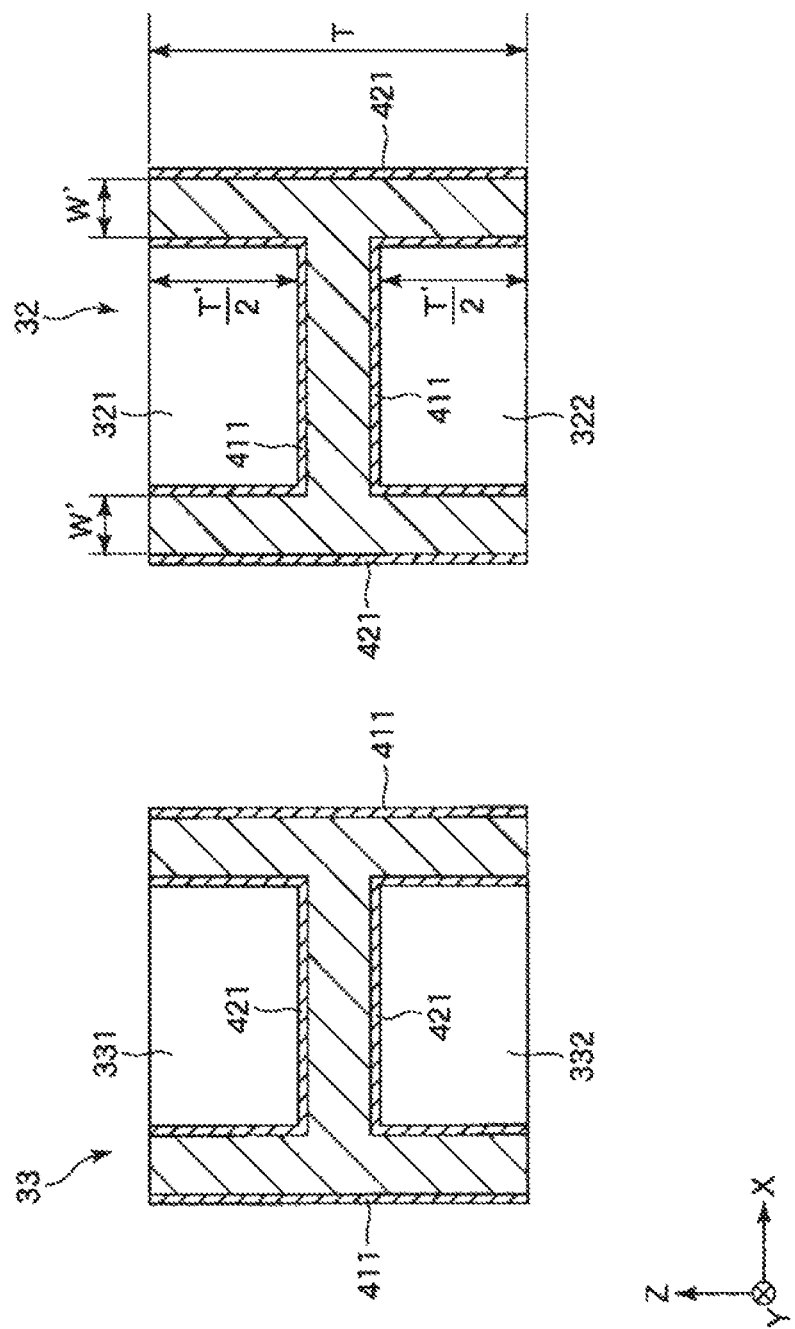
FIG. 3 is a cross-sectional view taken along line B-B of FIG. 1.

FIG. 1 is a plan view illustrating a vibrator according to the first embodiment of the invention. FIG. 2 is a cross-sectional view taken along line A-A of FIG. 1. FIG. 3 is a cross-sectional view taken along line B-B of FIG. 1. FIGS. 4A to 4F are plan views illustrating inherent vibration modes of a vibrator element. FIG. 5 is a graph illustrating a relationship between Δω and a Q value.

A vibrator 1 shown in FIGS. 1 and 2 includes a package 9 and a vibrator element 2 housed in the package 9.

Hereinafter, the package 9 and the vibrator element 2 will be described in order.

Package 9

As shown in FIGS. 1 and 2, the package 9 includes a box-shaped base 91 having a concave portion 911 which is open to the upper surface, and a plate-like lid 92, bonded to the base 91, which blocks an opening of the concave portion 911. Such package 9 has a hermetic housing space S formed by the concave portion 911 being blocked by the lid 92, and has the vibrator element 2 housed in this housing space S. Meanwhile, it is preferable that the inside of the housing space S is set to be in a decompressed (preferably, vacuum) state. Thereby, it is possible to reduce the viscous resistance of the vibrator element 2, and thus the vibration characteristics of the vibrator element 2 are improved.

In addition, internal terminals 951 and 952 are formed on the bottom of the concave portion 911 of the base 91. In addition, external terminals 961 and 962 are formed on the bottom of the base 91. The internal terminal 951 and external terminal 961, and the internal terminal 952 and the external terminal 962 are electrically connected to each other, respectively, through internal wirings (not shown) disposed in the base 91. In addition, the internal terminals 951 and 952 are provided with conductive adhesives (fixing members) 971 and 972. The vibrator element 2 is fixed to the base 91 through these conductive adhesives 971 and 972, and is electrically connected to the internal terminals 951 and 952.

Vibrator Element 2

As shown in FIGS. 1, 2 and 3, the vibrator element 2 includes a vibration substrate 3 and electrodes formed on the vibration substrate 3. Meanwhile, for convenience of description, the electrodes are not shown in FIG. 1.

The vibration substrate 3 is formed by patterning a Z cut quartz crystal plate. The Z cut quartz crystal plate refers to a quartz crystal substrate having a Z-axis (optical axis), which is the crystal axis of a quartz crystal, set to be in a thickness direction. Meanwhile, the Z-axis is preferably coincident with the thickness direction of the vibration substrate 3, but may be slightly (for example, approximately less than ±15°) inclined with respect to the thickness direction, from the viewpoint of reducing a frequency-temperature change in the vicinity of ordinary temperature. In addition, in the following, as shown in each drawing, the electrical axis of a quartz crystal is set to an X-axis, and the mechanical axis of the quartz crystal is set to a Y-axis.

As shown in FIG. 1, the vibration substrate 3 includes a base portion 31, a pair of vibrating arms 32 and 33 of which each one end in a longitudinal direction is coupled to the base portion 31, and which are disposed along in a Y-axis direction (second direction) of the longitudinal direction and are lined up along in an X-axis direction (first direction), and a support portion 34 which is coupled to the base portion 31. The base portion 31 is formed in a plate shape having a width in the XY plane and a thickness in the Z-axis direction. In addition, the vibrating arms 32 and 33 extend out in the +Y-axis direction from the end of the base portion 31 on the +Y-axis side so as to be lined up in the X-axis direction (first direction) and be parallel to each other.

In addition, as shown in FIG. 1, the vibrating arm 32 includes an arm 32A extending out from the base portion 31, and a weight portion 32B, provided on the tip side of the arm 32A, which has a width larger than that of the arm 32A. Similarly, the vibrating arm 33 includes an arm 33A extending out from the base portion 31, and a weight portion 33B, provided on the tip side of the arm 33A, which has a width larger than that of the arm 33A.

In addition, the vibrating arm 32 includes a bottomed groove portion 321 which is open to the upper surface (main surface on the +Z-axis side) and a bottomed groove portion 322 which is open to the lower surface (main surface on the −Z-axis side). Similarly, the vibrating arm 33 includes a bottomed groove portion 331 which is open to the upper surface and a bottomed groove portion 332 which is open to the lower surface. In this manner, the vibrating arms 32 and 33 are provided with the groove portions, and thus it is possible to reduce a thermoelastic loss in an adiabatic region, and to improve a Q value. Meanwhile, the total sum T' of the depths of the groove portions 321 and 322 (groove portions 331 and 332) is not particularly limited, but it is preferable to satisfy a relation of $0.8\ T \leq T' \leq 0.98\ T$. Thereby, the above effect becomes more conspicuous.

In addition, the support portion 34 is provided so as to extend out from the end of the base portion 31 on the −Y-axis side to the −Y-axis side, and further includes a pair of support arms 341 and 342 extending to the +Y-axis side in a folded state. The base portion 31 and the base end sides of the vibrating arms 32 and 33 are located between the pair of support arms 341 and 342.

In addition, the electrode includes first drive electrodes 411 and a first drive terminal 412, and second drive electrode 421 and a second drive terminal 422. The first drive electrodes 411 are disposed on the upper and lower surfaces (inner surfaces of the groove portions 321 and 322) of the vibrating arm 32 and on both lateral sides of the vibrating arm 33, and the second drive electrodes 421 are disposed on both lateral sides of the vibrating arm 32 and the upper and lower surfaces (inner surfaces of the groove portions 331 and 332) of the vibrating arm 33.

In addition, the first drive terminal 412 is disposed on the support arm 341, and is electrically connected to the first drive electrodes 411. Similarly, the second drive terminal 422 is disposed on the support arm 342, and is electrically connected to the second drive electrodes 421. In addition, the first drive terminal 412 comes into contact with a conductive adhesive 971, and the second drive terminal 422 comes into contact with a conductive adhesive 972. Thereby, the external terminal 961 and the first drive electrodes 411 are electrically connected to each other, and the external terminal 962 and the second drive electrodes 421 are electrically connected to each other.

Figure 4A:
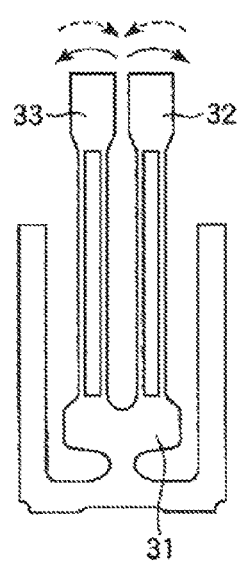
FIGS. 4A to 4F are plan views illustrating inherent vibration modes of a vibrator element.
Figure 5:
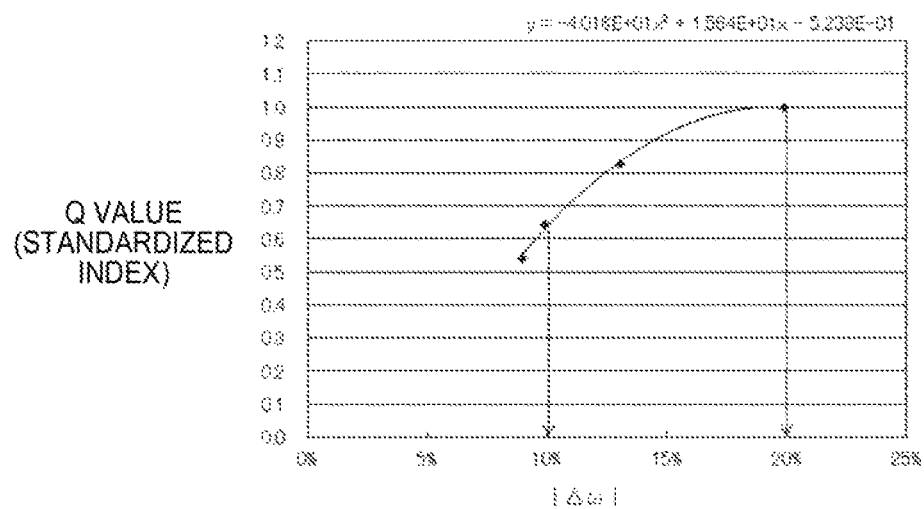
FIG. 5 is a graph illustrating a relationship between Δω and a Q value.

In such a vibrator element 2, in a case where an alternating voltage is applied between the first and second drive electrodes 411 and 421 through the external terminals 961 and 962, as shown in FIG. 4A, the vibrating arms 32 and 33 flexurally vibrate in the X-axis direction in reverse-phase (so as to repeat approach and separation to and from each other). Meanwhile, such a vibration mode is also referred to as an "X-axis reverse-phase mode (first direction reverse-phase mode)", and is a vibration mode (inherent vibration mode) in which the main vibration of the vibrator element 2 is set.

Meanwhile, the shape of the vibrator element 2 is not limited thereto. For example, the support portion 34 may be omitted. In this case, each of the first drive terminal 412 and the second drive terminal 422 may be provided on the base portion 31. In addition, the vibrating arms 32 and 33 may not include the weight portions 32B and 33B, and the weight portions 32B and 33B may not be larger in width than the arms 32A and 33A.

As stated above, the configuration of the vibrator element 2 has been described simply. Next, a description will be given of a relationship between the X-axis reverse-phase mode of the aforementioned main vibration and the other unnecessary vibration modes which are also the feature of the invention.

First, the unnecessary vibration mode will be described. The vibrator element 2 has an inherent vibration mode (unnecessary vibration mode) which is unstable with respect to a temperature and is not designed so that vibration leakage is reduced (or makes it difficult to reduce the leakage), in addition to the aforementioned main vibration (X-axis reverse-phase mode). In a case where the resonance frequency of this unnecessary vibration mode has a relationship, described later, with the resonance frequency of the main vibration, the unnecessary vibration mode internally resonates with the main vibration, and thus energy of the main vibration leaks to the outside through the unnecessary vibration mode. For this reason, the Q value of the main vibration deteriorates, the CI value of the main vibration increases accordingly, the resonance frequency of the main vibration does not stabilize, and the like, which lead to a deterioration in vibration characteristics.

Such an unnecessary vibration mode is not particularly limited insofar as the inherent vibration mode other than the main vibration is used, but includes, for example, at least one of an X-axis in-phase mode (first direction in-phase mode), a Z-axis reverse-phase mode (third direction reverse-phase mode), a Z-axis in-phase mode (third direction in-phase mode), a twisted reverse-phase mode, twisted in-phase mode and a high-order mode of each of these modes. Meanwhile, the order of each mode is not particularly limited, but is preferably second-order. Since a high-order mode has a greater tendency to be coupled to the main vibration as the order becomes smaller, the unnecessary vibration has a second-order mode, and the effect of the invention described below becomes more conspicuous. In addition, it is preferable that the unnecessary vibration includes at least one of the respective second-order modes of the X-axis reverse-phase mode, the X-axis in-phase mode, the Z-axis reverse-phase mode, and the Z-axis in-phase mode, among the high-order modes. Since these modes are low in resonance frequency among the second-order modes, and have a greater tendency to be coupled to the main vibration, the unnecessary vibration has these second-order modes, and thus the effect of the invention described below becomes more conspicuous.

Figure 4B:
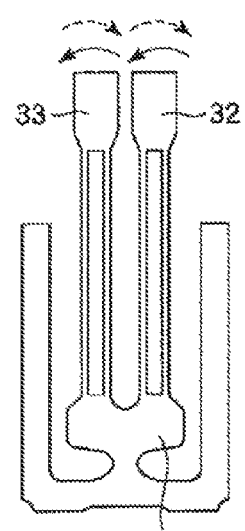
Figure 4C:
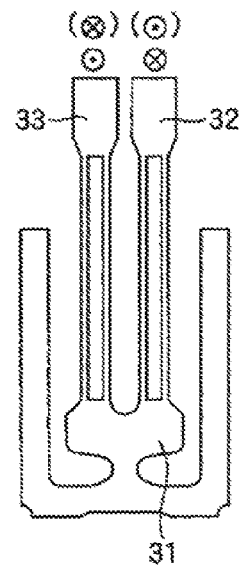
Figure 4D:
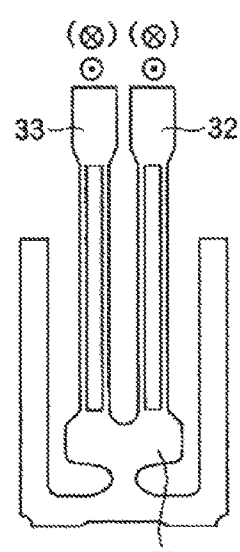
Figure 4E:
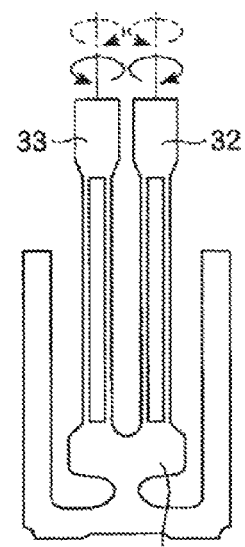
Figure 4F:
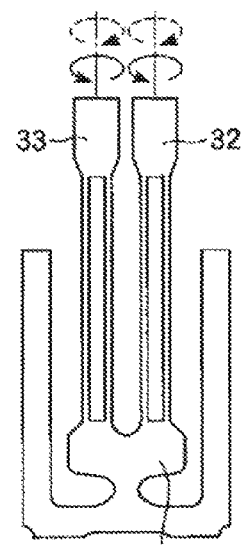

Meanwhile, the X-axis in-phase mode refers to an inherent mode in which the vibrating arms 32 and 33 flexurally vibrate in phase (mutually in the same direction) in the X-axis direction as shown in FIG. 4B, the Z-axis reverse-phase mode refers to an inherent mode in which the vibrating arms 32 and 33 flexurally vibrate in reverse-phase in the Z-axis direction as shown in FIG. 4C, the Z-axis in-phase mode refers to an inherent mode in which the vibrating arms 32 and 33 flexurally vibrate in phase in the Z-axis direction (third direction) as shown in FIG. 4D, the twisted reverse-phase mode refers to an inherent mode in which the vibrating arms 32 and 33 are twisted in reverse-phase around the axes (virtual central line along the Y-axis direction through the center of the cross section of the vibrating arms 32 and 33 along the X-axis direction and the Z-axis direction) as shown in FIG. 4E, and the twisted in-phase mode refers to an inherent mode in which the vibrating arms 32 and 33 are twisted in phase around the axes as shown in FIG. 4F. Meanwhile, arrows in the drawings, "•" in "O" and "x" in "O" represent the displacement directions of the vibrating arms ("•" in "O" is the frontward direction of paper, and "x" in "O" is the depthwise direction of paper), and represent alternate repetition depending on solid lines and broken lines, or the presence or absence of parentheses.

Next, a relationship between the resonance frequency of the main vibration (X-axis reverse-phase mode) and the resonance frequency of the above-mentioned unnecessary vibration mode will be described.

When the vibrator element 2 has n (where, n is a natural number equal to or greater than 2) inherent vibration modes, that is, the X-axis reverse-phase mode which is the main vibration and at least one unnecessary vibration mode, the resonance frequency of each inherent vibration mode is set to $\omega_j$, an arbitrary integer is set to $k_j$ (where, two or more of $k_j$ are not 0 ($\neq$0), and $k_1 \neq 0$), and the resonance frequency of the main vibration among the resonance frequencies $\omega_j$ is set to $\omega_1$ (that is, j=1), the following Expression (1) and the following Expression (2) are satisfied.

$$\Delta\omega \equiv \left(\frac{\sum_{j=2}^{n} k_j \omega_j}{-k_1} - \omega_1\right) / \omega_1 \quad (1)$$

$$|\omega_1| \geq 0.1 \quad (2)$$

Further, the integer $k_j$ and the natural number n satisfy the following Expression (3) and Expression (4).

$$3 \leq \sum_{j=1}^{n} |k_j| \leq 10 \quad (3)$$

$$n \leq \sum_{j=1}^{n} |k_j| \quad (4)$$

By satisfying Expression (2), it is possible to reduce internal resonance between the unnecessary vibration mode and the main vibration, and thus it is possible to reduce the leakage of energy of the main vibration through the unnecessary vibration mode. Therefore, the vibrator element 2 (vibrator 1) is obtained which has a small vibration leakage and is capable of exhibiting excellent vibration characteristics. Hereinafter, this reason will be described.

First, conditions in which internal resonance occurs will be described. In the occurrence of internal resonance, it is necessary for the vibrator element 2 to have a plurality of inherent vibration modes, that is, the X-axis reverse-phase mode which is the main vibration and at least one unnecessary vibration mode (condition A1). Further, it is also necessary to satisfy the following Expression (5) (condition A2). Here, the representation of "≈" in the following Expression (5) means the presence of an allowable amount for which a certain amount of internal resonance occurs even when the left side of the following Expression (5) is not strictly zero. Meanwhile, when the resonance frequency of each inherent vibration mode is set to $\omega_n$, at least the relation of $\omega_i > 0$ is satisfied. In addition, n is a natural number equal to or greater than 2. Where, $k_1, k_2, \ldots, k_i, \ldots, k_n$ in Expression (5) are integers, and at least two of them are not 0 ($\neq$0). In addition, i is a natural number equal to or greater than 1 and equal to or less than n.

$$k_1\omega_1 + k_2\omega_2 + \ldots + k_i\omega_i + \ldots + k_n\omega_n \approx 0 \quad (5)$$

In addition, it is necessary that the frequency Q (>0) of an electrical signal for exciting the main vibration is substantially equal to the resonance frequency e) of the main vibration. That is, it is necessary to satisfy the relation of $\Omega \approx \omega_1$ (condition A3). The reason for the wording "substantially equal" as used herein is because the resonance frequency during the vibration of a structure having, for example, piezoelectricity in an electrically opened state has a slight difference with an electrically excited resonance frequency, but hereinafter, "equal" is represented instead of "substantially equal", then the both are identified with each other. In addition, the resonance frequency of the main vibration mode or the unnecessary vibration mode during a vibration by mechanical excitation from the outside is also identified with the resonance frequency of each inherent vibration mode in the invention. This is because the difference is sufficiently small as compared to Expression (2) or Expression (12). Meanwhile, the resonance frequency of the main vibration mode or the unnecessary vibration mode can be measured by heterodyne interferometry or the like in a state where the lid 92 is removed from the package 9. In this case, in a case where vibration displacement in each vibration mode is caused not to increase excessively, it has been confirmed by the inventors that an error between measurement with the inside of the package 9 set in an atmospheric state and measurement in a decompressed state is sufficiently small.

The internal resonance occurs by satisfying all the conditions A1, A2, and A3 stated above. For this reason, at least one of the conditions A1, A2, and A3 has only not to be satisfied in order to reduce the internal resonance. The vibrator element 2 is configured not to satisfy the condition A2. That is, in the vibrator element 2, the following Expression (6) is satisfied instead of Expression (5).

$$k_1\omega_1+k_2\omega_2+\ldots+k_i\omega_i+\ldots+k_n\omega_n \neq 0 \quad (6)$$

Next, the allowable amount contained in the representation of "≈" in Expression (5) is specified. When the virtual resonance frequency in the vicinity of the main vibration is set to $\omega_1'$, $\omega_1'$ can be defined by the following Expression (7).

$$\omega_1' \equiv \frac{k_2\omega_2 + k_3\omega_3 + \ldots + k_n\omega_n}{-k_1} \quad (7)$$

This is calculated from the resonance frequency of an inherent vibration other than the main vibration, and is a virtual resonance frequency at which strongest internal resonance occurs when $\omega_1'$ and $\omega_1$ are equal to each other.

When a value obtained by standardizing the difference between the virtual resonance frequency $\omega_1'$ in the vicinity of the main vibration and the resonance frequency $\omega_1$ of the main vibration by the resonance frequency $\omega_1$ of the main vibration is set to $\Delta\omega$, this value is the above-mentioned allowable amount, and $\Delta\omega$ can be represented by the following Expression (8).

$$\Delta\omega \equiv \frac{\omega_1' - \omega_1}{\omega_1} \quad (8)$$

When Expression (7) is substituted into Expression (8), the following Expression (9) is obtained.

$$\Delta\omega \equiv \left(\frac{k_2\omega_2 + k_3\omega_3 + \ldots + k_n\omega_n}{-k_1} - \omega_1\right)\bigg/ \omega_1 \quad (9)$$

The arrangement of Expression (9) makes Expression (1) obtained. Therefore, the vibrator element 2 having a reduction in internal resonance is obtained by satisfying Expression (1). Here, as described above, $k_1, k_2, \ldots, k_i, \ldots, k_n$ in Expression (5) are integers, and at least two of them are not 0. It is preferable that a resonance frequency $\omega_m$ using k (set to $k_m$) which is not 0 as a coefficient is substantially equal to a resonance frequency in an unnecessary vibration mode in which the Z-axis direction perpendicular to the X-axis which is the vibration direction of the main vibration is set to a displacement direction, that is, the Z-axis in-phase mode or the Z-axis reverse-phase mode. In other words, it is preferable that the vibrator element 2 has the Z-axis in-phase mode or the Z-axis reverse-phase mode as an unnecessary vibration mode. In addition, it is preferable to include these high-order modes, but it is particularly preferable to include a lowest-order mode, or a second-order mode. Such an unnecessary vibration mode is, particularly, a vibration having a tendency to be coupled to the main vibration among other unnecessary vibration modes. For this reason, an effect due to satisfying Expression (1) further increases.

In addition, the vibrator element 2 preferably has an unnecessary vibration mode with a resonance frequency ten times or less the resonance frequency of the main vibration, and more preferably has an unnecessary vibration mode with a resonance frequency three times or less the above resonance frequency. The unnecessary vibration mode having such a frequency has a concern of being more strongly coupled to the main vibration than in other unnecessary vibration modes. For this reason, an effect due to satisfying Expression (1) further increases.

In addition, in the vibrator 1, it is preferable that Expression (2) is satisfied with respect to all the unnecessary modes having a resonance frequency three times or less the resonance frequency of the main vibration, and more preferable that Expression (2) is satisfied with respect to all the unnecessary modes having a resonance frequency ten times or less the above resonance frequency. In this manner, it is possible to drastically reduce a concern of the occurrence of internal resonance with an unnecessary mode having a tendency to be strongly coupled to the main vibration.

In addition, it is preferable to have an unnecessary vibration mode with a lower resonance frequency than the resonance frequency of the main vibration mode. That is, it is preferable to have an unnecessary vibration mode with a resonance frequency $\omega_2$ satisfying the relation of $\omega_1 > \omega_2$ with respect to the resonance frequency $\omega_1$ of the main vibration mode. This is because the unnecessary vibration mode having a lower resonance frequency than that in the main vibration mode, particularly, among the unnecessary vibration modes has a tendency to internally resonate with the main vibration.

Meanwhile, as described above, in the vibrator element 2, Expression (3) is further satisfied. Expression (3) is to perform the restriction of an internal resonance order. This internal resonance order has a relationship with a non-linear order, and is more greatly influenced by the internal resonance even when non-linearity is small as a condition has a smaller non-linear order. Therefore, by satisfying Expression (3) and Expression (2), it is possible to effectively reduce a concern of the internal resonance occurring in, particularly, a condition which is greatly influenced by the internal resonance.

Meanwhile, the vibrator 1 is not particularly limited insofar as Expression (3) is satisfied, but it is more preferable to satisfy the following Expression (10), and still more preferable to satisfy the following Expression (11). Thereby, coupling between the main vibration and the unnecessary vibration mode is not likely to occur even in the vibrator element 2 in which low-order non-linearity appears conspicuously, and thus it is possible to reduce the vibration leakage of the main vibration through the unnecessary vibration mode.

$$3 \leq \sum_{j=1}^{n} |k_j| \leq 6 \quad (10)$$

$$3 \leq \sum_{j=1}^{n} |k_j| \leq 4 \quad (11)$$

In addition, n is preferably equal to or less than 3, and is more preferably 2. This is because, there is a greater tendency for internal resonance to occur as the value of n becomes smaller, and the effect of the invention increases.

In addition, in the vibrator 1, Expression (2) is satisfied as described above. When $|\Delta\omega|$ is excessively close to 0, there is a tendency for the unnecessary vibration mode to occur due to the internal resonance with the main vibration. Therefore, by satisfying Expression (2), it is possible to reduce the occurrence of the unnecessary vibration mode. Hereinafter, this will be described simply. In addition, in the following, a case where the unnecessary vibration mode is the X-axis in-phase mode will be described representatively for convenience of description, but it is confirmed that the same relation is satisfied even in a case where the unnecessary vibration modes other than the X-axis in-phase mode are used.

FIG. 5 is a graph illustrating a relationship between $|\Delta\omega|$ and a Q value. Herein, the main vibration mode is $\Delta\omega$ in a case where the resonance frequency $\omega_1$ of the X-axis reverse-phase mode and the resonance frequency $\omega_2$ of the X-axis in-phase mode come close to each other at a ratio of 1:1, that is, $\Delta\omega=(\omega_2-\omega_1)/\omega_1$ ($k_1=-1$, $k_2=1$), and is an actual measured value of coupling known hitherto, but it is confirmed that the same effect is obtained even in coupling having ratios other than 1:1. Meanwhile, the vertical axis of FIG. 5 represents an index obtained by standardizing the Q value by the maximum value thereof (that is, the maximum value of the index is set to 1). In addition, FIG. 5 shows actual measured values obtained by using the vibrator element 2 having a size configured such that the length L of the vibrating arms 32 and 33 is 930 μm, the width W of the vibrating arms 32 and 33 is 60 μm, the total length of the vibrator element 2 is 1,160 μm, and the total width thereof is 520 μm.

As can be seen from FIG. 5 described above, when Expression (2) is satisfied, it is possible to exhibit more than 60% of the maximum value of the standardized index, and to sufficiently reduce the unnecessary vibration mode. Meanwhile, the vibrator 1 is not particularly limited insofar as Expression (2) is satisfied, but it is more preferable to satisfy the following Expression (12). Thereby, it is possible to further effectively reduce the occurrence of the unnecessary vibration mode due to the internal resonance with the main vibration. Therefore, it is possible to more effectively reduce the leakage of energy of the main vibration through the unnecessary vibration mode.

Meanwhile, when Expression (2) or the following Expression (12) is satisfied at ordinary temperature, it is possible to reduce the leakage of energy of the main vibration at ordinary temperature. In addition, when Expression (2) or the following Expression (12) is satisfied in an operating temperature range inclusive of temperature other than ordinary temperature, for example, the entire range of −40° C. to 85° C. or −40° C. to 150° C., it is possible to reduce the leakage of energy of the main vibration within the temperature range.

$$|\Delta\omega| \geq 0.2 \tag{12}$$

As stated above, the vibrator 1 has been described.

Next, some specific examples will be given of a case where the number (n) of inherent vibration modes is 2, 3, and 4. Meanwhile, in the following, it is assumed that the relation of the following Expression (13) is satisfied. In addition, the resonance frequency of the main vibration is set to $\omega_1$, and the frequency of the unnecessary vibration mode is set to $\omega_2$.

$$m = \sum_{j=1}^{n} |k_j| \tag{13}$$

Specific Example 1: m=3, n=2

In this case, the following Expression (14) can be derived from Expression (7).

$$\omega_1' = -\frac{k_2}{k_1}\omega_2 \tag{14}$$

For example, when $k_1=1$ and $k_2=-2$, the relation of $\omega_1'=2\omega_2$ is established, and the following Expression (15) can be derived from Expression (8). When $k_1=2$ and $k_2=-1$, the relation of $\omega_1'=\omega_2/2$ is established, and the following Expression (16) can be derived from Expression (8).

$$\Delta\omega = \frac{2\omega_2 - \omega_1}{\omega_1} \tag{15}$$

$$\Delta\omega = \frac{\frac{\omega_2}{2} - \omega_1}{\omega_1} \tag{16}$$

In addition, in the invention, since it is necessary to satisfy Expression (3) (or Expression (10) Expression (11)), the relation of $3 \leq |k_1|+|k_2|$ has to be established when n=2. That is, the condition of $k_1=1$ and $k_2=-1$ is not included in the invention. In such a condition, $\omega_1'=\omega_2$ is derived from Expression (14), and $\Delta\omega=(\omega_2-\omega_1)/\omega_1$ is derived from Expression (8). In a condition in which the relation of $|\Delta\omega|\approx 0$ is established, the relation of $\omega_2 \approx \omega_1$ is eventually established. This represents coupling known hitherto in which the resonance frequency $\omega_1$ of the main vibration mode and the resonance frequency $\omega_2$ of the unnecessary vibration mode are coupled adjacently to each other. In the invention, a coupling state is disclosed which is not able to be known at all from such hitherto known coupling occurring by the resonance frequency of the main vibration mode and the resonance frequency of the unnecessary vibration mode coming close to each other.

In addition, in the invention, it is premised that, as an electrical signal for exciting the main vibration, only a sinusoidal signal having a frequency $\Omega$ equal to the resonance frequency of the main vibration, or an electrical signal in a state of being close thereto is input. For example, in a case where a square wave is input as the electrical signal, a sine wave having a frequency component of an odd multiple ($3\Omega$, $5\Omega$, . . . ) of $\Omega$ is input in addition to the sine wave of the frequency $\Omega$, and in a case where one (particularly, $3\Omega$ having a small numeral has also a great influence due to a large amplitude) of frequencies of an odd multiple of $\Omega$ and one resonance frequency within the unnecessary vibration mode come close to each other, the unnecessary vibration mode is excited, but this is not included in the invention. In addition, in a case where a duty ratio is other than 50%, a sine wave having a frequency component of an even multiple ($2\Omega$, $4\Omega$, . . . ) of $\Omega$ is input, but this is not also included in the invention.

Specific Example 2: m=3, n=3

In this case, the following Expression (17) can be derived from Expression (7).

$$\omega'_1 = \frac{k_2\omega_2 + k_3\omega_3}{-k_1} \quad (17)$$

For example, when $k_1=-1$ and $k_2=k_3=1$, the relation of $\omega_1'=\omega_2+\omega_3$ is established, and the following Expression (18) can be derived from Expression (8). When $k_1=k_3=-1$ and $k_2=1$, the relation of $\omega_1'=\omega_2-\omega_3$ is established, and the following Expression (19) can be derived from Expression (8).

$$\Delta\omega = \frac{\omega_2 + \omega_3 - \omega_1}{\omega_1} \quad (18)$$

$$\Delta\omega = \frac{\omega_2 - \omega_3 - \omega_1}{\omega_1} \quad (19)$$

Specific Example 3: m=4, n=2

For example, when $k_1=-1$ and $k_2=3$, the relation of $\omega_1'=3\omega_2$ is established, and the following Expression (20) can be derived from Expression (8). When $k_1=3$ and $k_2=2$, the relation of $\omega_1'=\omega_2/3$ is established, and the following Expression (21) can be derived from Expression (8).

$$\Delta\omega = \frac{3\omega_2 - \omega_1}{\omega_1} \quad (20)$$

$$\Delta\omega = \frac{\frac{\omega_2}{3} - \omega_1}{\omega_1} \quad (21)$$

Specific Example 4: m=4, n=3

For example, when $k_1=-2$ and $k_2=k_3=1$, the relation of $\omega_1'=(\omega_2+\omega_3)/2$ is established, and the following Expression (22) can be derived from Expression (8). When $k_1=-2$, $k_2=1$, and $k_3=-1$, $\omega_1'=(\omega_2-\omega_3)/2$ is established, and the following Expression (23) can be derived from Expression (8). When $k_1=-1$, $k_2=2$, and $k_3=1$, the relation of $\omega_1'=2\omega_2+\omega_3$ is established, and the following Expression (24) can be derived from Expression (8). When $k_1=-1$, $k_2=2$, and $k_3=-1$, the relation of $\omega_1'=2\omega_2-\omega_3$ is established, and the following Expression (25) can be derived from Expression (8).

$$\Delta\omega = \frac{\frac{\omega_2 + \omega_3}{2} - \omega_1}{\omega_1} \quad (22)$$

$$\Delta\omega = \frac{\frac{\omega_2 - \omega_3}{2} - \omega_1}{\omega_1} \quad (23)$$

$$\Delta\omega = \frac{2\omega_2 + \omega_3 - \omega_1}{\omega_1} \quad (24)$$

$$\Delta\omega = \frac{2\omega_2 - \omega_3 - \omega_1}{\omega_1} \quad (25)$$

Specific Example 4: m=4, n=4

In this case, the following Expression (26) can be derived from Expression (7).

$$\omega'_1 = \frac{k_2\omega_2 + k_3\omega_3 + k_4\omega_4}{-k_1} \quad (26)$$

For example, when $k_1=-1$ and $k_2=k_3=k_4=1$, the relation of $\omega_1'=\omega_2+\omega_3+\omega_4$ is established, and the following Expression (27) can be derived from Expression (8). When $k_1=k_3=-1$ and $k_2=k_4=1$, the relation of $\omega_1'=\omega_2-\omega_3+\omega_4$ is established, and the following Expression (28) can be derived from Expression (8). When $k_1=k_4=-1$ and $k_2=k_3=1$, the relation of $\omega_1'=\omega_2+\omega_3-\omega_4$ is established, and the following Expression (29) can be derived from Expression (8). When $k_1=k_3=k_4=-1$ and $k_2=1$, the relation of $\omega_1'=\omega_2-\omega_3-\omega_4$ is established, and the following Expression (30) can be derived from Expression (8).

$$\Delta\omega = \frac{\omega_2 + \omega_3 + \omega_4 - \omega_1}{\omega_1} \quad (27)$$

$$\Delta\omega = \frac{\omega_2 - \omega_3 + \omega_4 - \omega_1}{\omega_1} \quad (28)$$

$$\Delta\omega = \frac{\omega_2 + \omega_3 - \omega_4 - \omega_1}{\omega_1} \quad (29)$$

$$\Delta\omega = \frac{\omega_2 - \omega_3 - \omega_4 - \omega_1}{\omega_1} \quad (30)$$

Next, some specific examples will be given of a case where the inherent vibration mode is specified.

Specific Example 1

For example, in a case where the vibrator element 2 has the main vibration (resonance frequency $\omega_1=32.768$ kHz), and has the Z-axis in-phase mode (resonance frequency $\omega_2=20.49$ kHz) as the unnecessary vibration mode, it is necessary to satisfy the relation of $k_1\omega_1+k_2\omega_2=0$ as a condition in which internal resonance occurs most strongly. However, a combination of $\{k_1, k_2\}$ in which the above expression is satisfied within the range of m≤10 (see Expression (3)) is not present. Therefore, in this case, when m=3 which is a condition in which Expression (6) is satisfied and $|\Delta\omega|$ becomes smallest is taken by way of example, the relation of $|\Delta\omega|=25.06\%$ is established from Expression (15), and thus it can be understood that the unnecessary vibration mode is not likely to be coupled to the main vibration.

Specific Example 2

For example, in a case where the vibrator element 2 has the main vibration (resonance frequency $\omega_1=32.768$ kHz) and has the Z-axis reverse-phase mode (resonance frequency $\omega_2=82.05$ kHz) as the unnecessary vibration mode, it is necessary to satisfy the relation of $k_1\omega_1+k_2\omega_2=0$ as a condition in which the internal resonance occurs most strongly. However, a combination of $\{k_1, k_2\}$ for satisfying the above expression within the range of m≤10 (see Expression (3)) is not present. Therefore, in this case, when m=3 of a condition in which Expression (6) is satisfied and $|\Delta\omega|$ becomes smallest is taken by way of example, the relation of $|\Delta\omega|=25.20\%$ is established from Expression (16), and thus it can be understood that the unnecessary vibration mode is not likely to be coupled to the main vibration.

As stated above, the specific examples have been described by way of example.

Meanwhile, the size of the vibrator element 2 is not particularly limited, but the length L of the vibrating arms 32 and 33 preferably satisfies the relation of L≤0.9 mm, more preferably satisfies the relation of L≤0.7 mm, and most preferably satisfies the relation of L≤0.5 mm. In addition, the thickness T of the vibrating arms 32 and 33 preferably satisfies the relation of 50 μm≤T≤150 μm, more preferably satisfies the relation of 80 μm≤T≤140 μm, and most preferably satisfies the relation of 120 μm≤T≤130 μm. In addition, the width W of the arms 32A and 33A of the vibrating arms 32 and 33 is preferably W≤60 μm, but is more preferably W≤45 μm, and is most preferably W≤30 μm. In addition, the width W' of the main surfaces remaining on both sides of the groove portions 321 and 322 (331, 332) of the arm 32A (33A) preferably satisfies the relation of W'≤6 μm, more preferably satisfies the relation of W'≤4.5 μm, and most preferably satisfies the relation of W'≤3 μm. In addition, the length L' of the weight portion 32B of the arm 32A (33A) preferably satisfies the relation of L'/L≤0.5, more preferably satisfies the relation of L'/L≤0.35, and most preferably satisfies the relation of L'/L≤0.25. In addition, the width W" and the length L' of the weight portion 32B (33B) preferably satisfy the relation of L'<W".

The vibrator element 2 is set to have the size as described above, and thus the vibrator element 2 which is relatively small in size is obtained. For this reason, particularly in a case where the vibration substrate 3 is obtained by patterning a quartz crystal wafer using wet etching, damage to the symmetry of the shape and an increase in non-linearity due to etching anisotropy of a quartz crystal substrate make the main vibration and the unnecessary vibration more likely to cause the internal resonance. Thus, energy of the main vibration leaks to the outside through the unnecessary vibration which is not designed so that vibration leakage is reduced (or makes it difficult to reduce the leakage). Particularly, the width W' is set to be relatively small, the weight portions 32B and 33B are provided, and the relation of L'<W" is satisfied, whereby the asymmetry of the transverse cross-sectional shapes of the vibrating arms 32 and 33 is likely to occur, which leads to the above-mentioned problem becoming more conspicuously. Therefore, in the vibrator element having a size which makes such an unnecessary vibration more likely to occur, the aforementioned configuration is adopted, thereby allowing the aforementioned effect to be more conspicuously exhibited.

In addition, the unnecessary vibration mode includes a mode in which the structure of a lid or a package vibrates, and a vibration mode in which, in a case where a support arm is formed, the support arm vibrates independently or in conjunction with the structure of a vibrator element other than the support arm such as a vibrating arm, thereby allowing the minute leakage of energy from the main vibration to be further reduced. Moreover, in case where only a pair of vibrating arms extending in the same direction are included as the vibrating arm like a tuning fork type vibration element, the symmetry of a shape in an opposite direction to the above-mentioned extending direction with reference to the base portion is not taken, and thus the invention acts more effectively.

In addition, in a quartz crystal, the crystal plane is formed to be complicated. Therefore, in a case where a vibration element is formed by wet etching using a quartz crystal as a base material, the invention can be implemented more effectively.

Second Embodiment

Next, a vibrator according to a second embodiment of the invention will be described.

Figure 6:
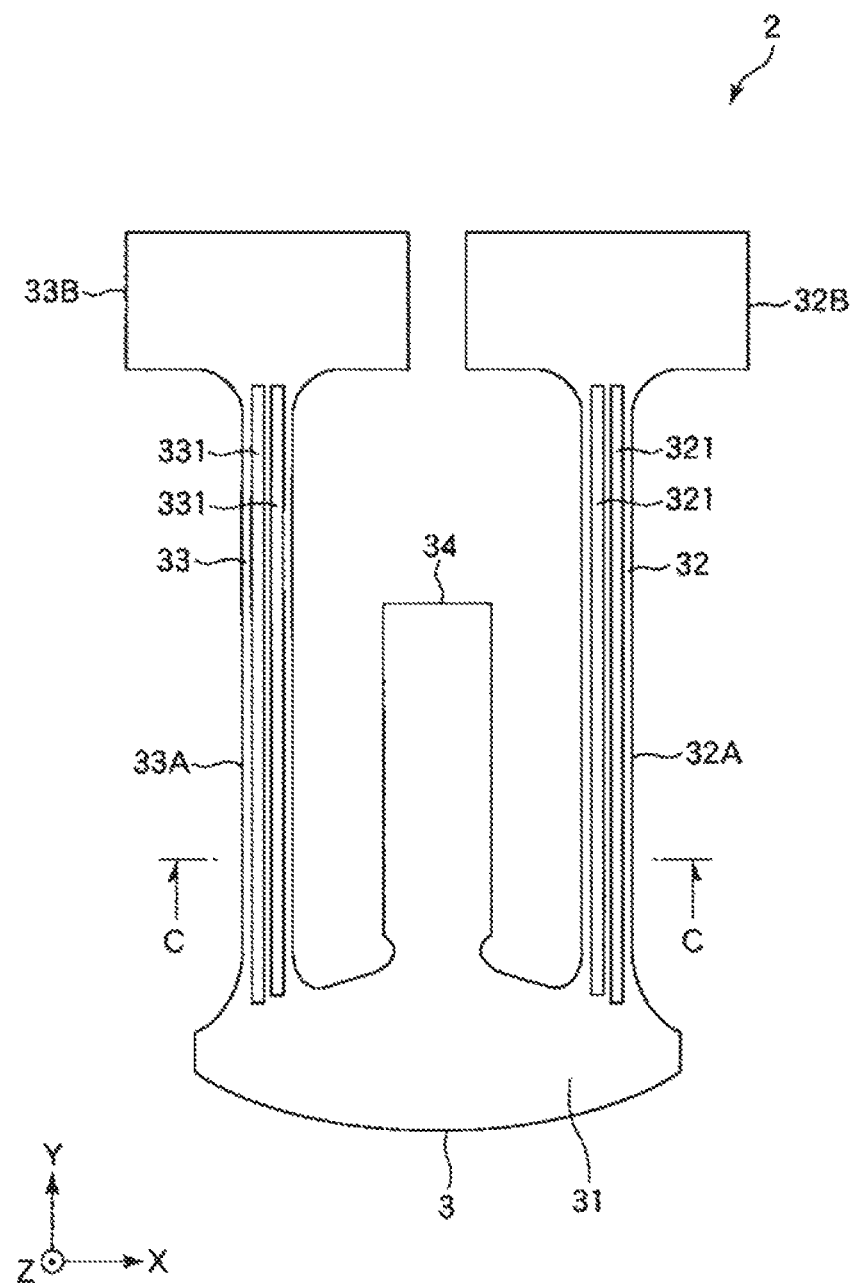
FIG. 6 is a plan view illustrating a vibrator element having a vibrator according to a second embodiment of the invention.
Figure 7:
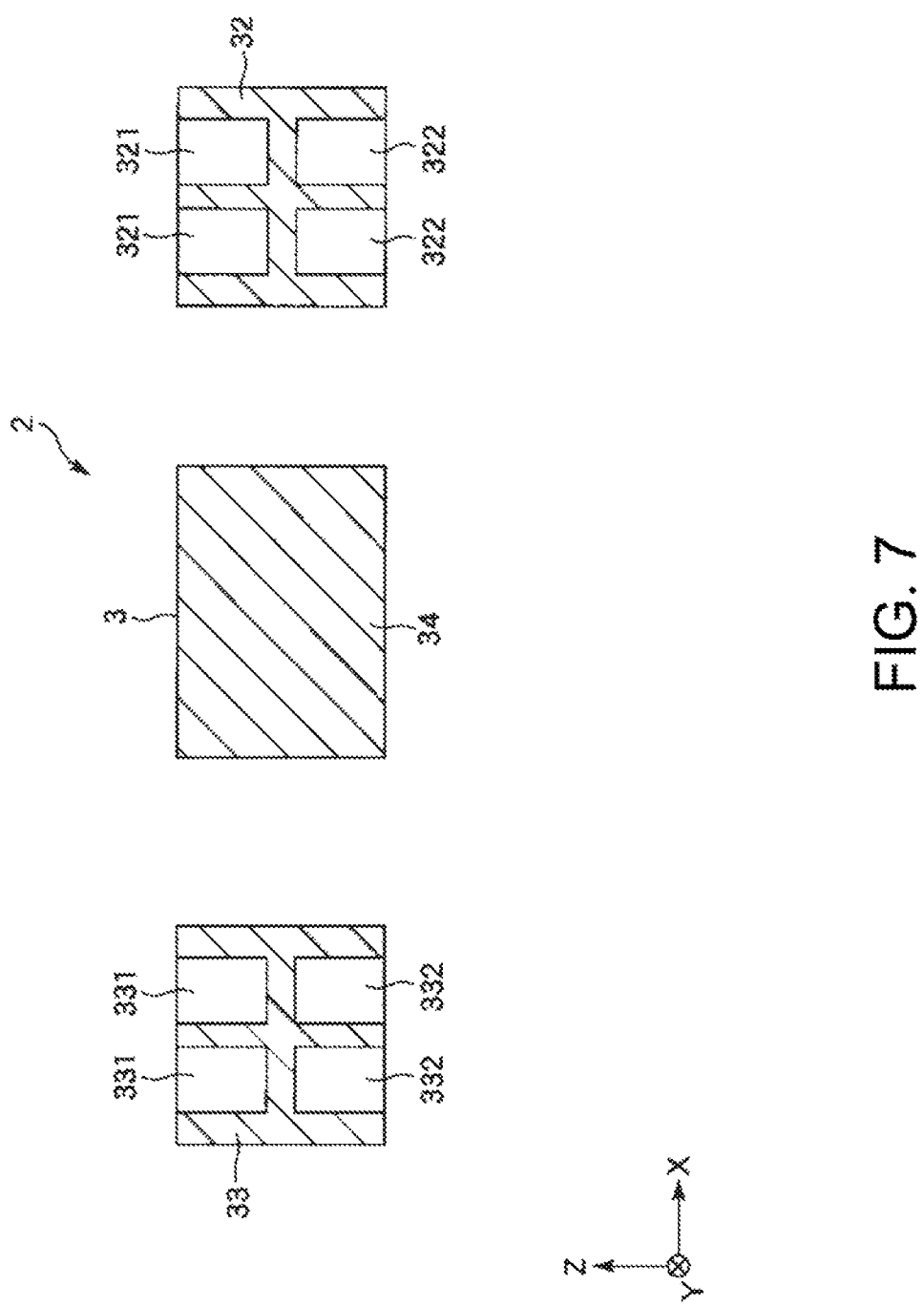
FIG. 7 is a cross-sectional view taken along line C-C of FIG. 6.

FIG. 6 is a plan view illustrating a vibrator element including a vibrator according to a second embodiment of the invention. FIG. 7 is a cross-sectional view taken along line C-C of FIG. 6. Meanwhile, in FIGS. 6 and 7, electrodes are not shown for convenience of description.

Hereinafter, the vibrator according to the second embodiment will be described with a focus on differences from the aforementioned first embodiment, and the description of similar particulars will not be given.

The vibrator according to the second embodiment of the invention is the same as that of the aforementioned first embodiment, except for a difference in the configuration of the vibrator element. Meanwhile, the same components as those of the aforementioned first embodiment are denoted by the same reference numerals and signs.

As shown in FIG. 6, the vibrator element 2 of the present embodiment is provided so that the support portion 34 extends out between the vibrating arms 32 and 33 from the end of the base portion 31 on the +Y-axis side. In addition, a pair of groove portions 321 are provided on the upper surface of the vibrating arm 32 so as to be lined up in the X-axis direction, and a pair of groove portions 322 are provided on the lower surface thereof so as to be lined up in the X-axis direction. Similarly, a pair of groove portions 331 are provided on the upper surface of the vibrating arm 33 so as to be lined up in the X-axis direction, and a pair of groove portions 332 are provided on the lower surface thereof so as to be lined up in the X-axis direction. With such an arm shape, it is also possible to sufficiently reduce a thermoelastic loss. Meanwhile, only one of the respective groove portions 321, 322, 331, and 332 may be provided as in the aforementioned first embodiment.

In the second embodiment described above, it is also exhibit the same effect as that in the aforementioned first embodiment.

Third Embodiment

Next, a vibrator according to a third embodiment of the invention will be described.

Figure 8:
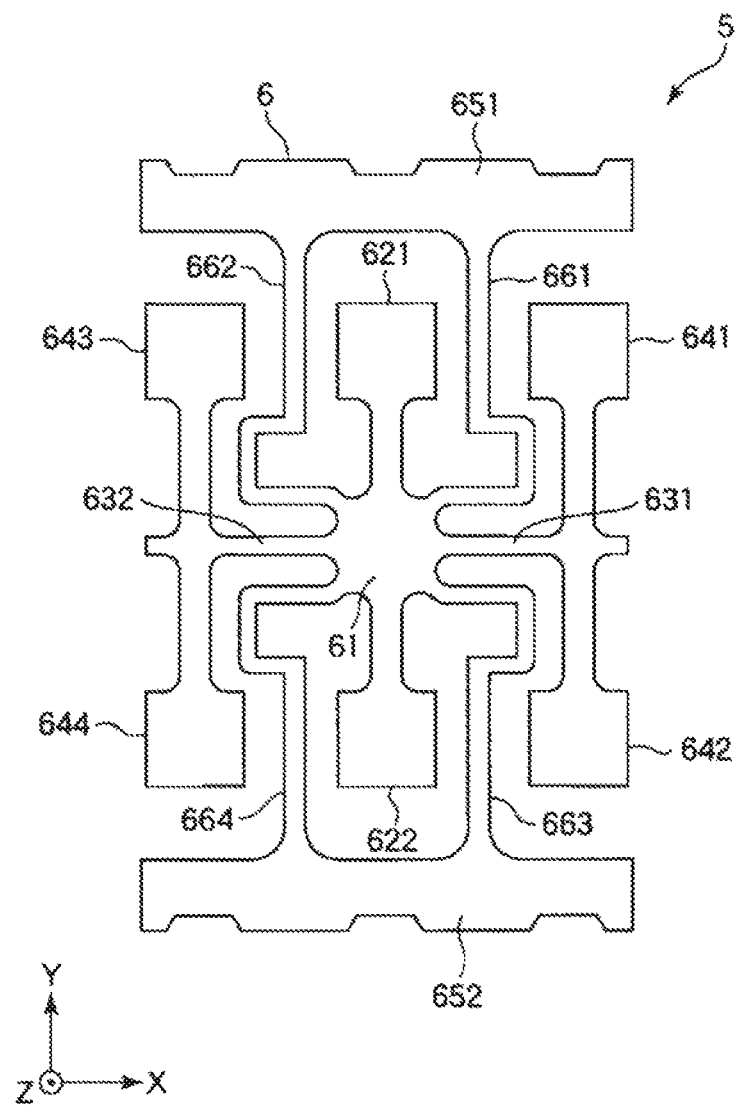
FIG. 8 is a plan view illustrating a vibrator element having a vibrator according to a third embodiment of the invention.
Figure 9A:
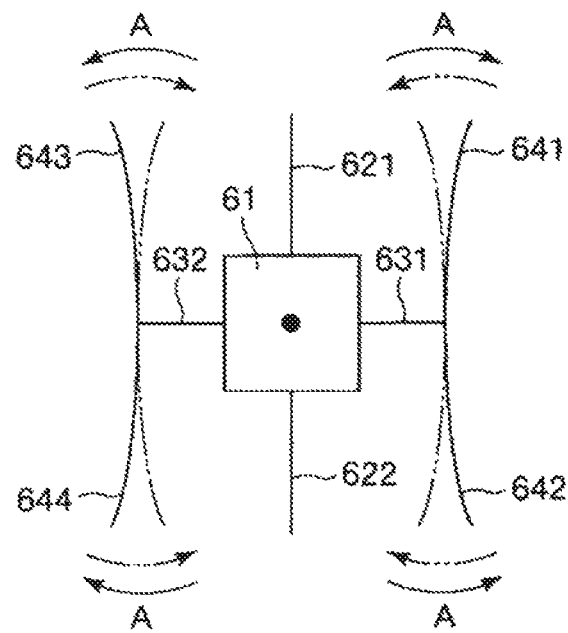
FIGS. 9A and 9B are diagrams illustrating operations of the vibrator element shown in FIG. 8.
Figure 9B:
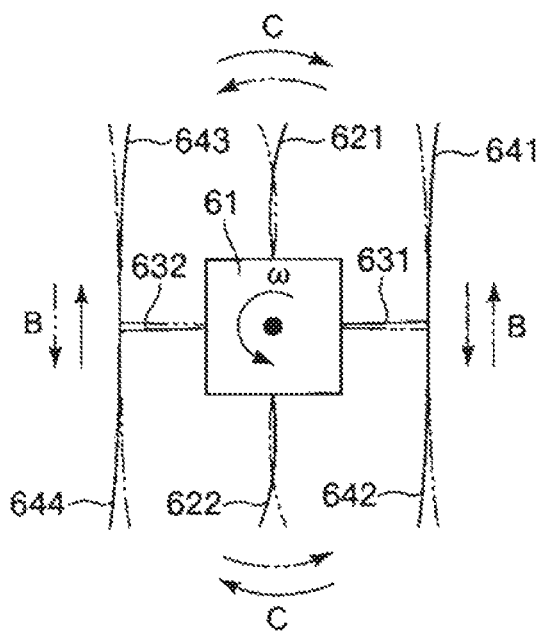

FIG. 8 is a plan view illustrating a vibrator element including a vibrator according to the third embodiment of the invention. FIGS. 9A and 9B are diagrams illustrating operations of the vibrator element shown in FIG. 8.

Hereinafter, the vibrator of the third embodiment will be described with a focus on differences from the aforementioned first embodiment, and the description of similar particulars will not be given.

The vibrator according to the third embodiment of the invention is the same as that of the aforementioned first embodiment, except for a difference in the configuration of the vibrator element. Meanwhile, the same components as those of the aforementioned first embodiment are denoted by the same reference numerals and signs.

The vibrator element 5 of the present embodiment is an angular velocity detection element capable of detecting an angular velocity. As shown in FIG. 8, the vibrator element 5 includes a vibration substrate 6 and electrodes (not shown) provided in the vibration substrate 6.

The vibration substrate 6 includes a base portion 61, detection arms 621 and 622 extending out from the base portion 61 to both sides in the Y-axis direction, connecting arms 631 and 632 extending out from the base portion 61 to both sides in the X-axis direction, drive arms 641 and 642 extending out from the connecting arm 631 to both sides in the Y-axis direction, drive arms 643 and 644 extending out from the connecting arm 632 to both sides in the Y-axis direction, support portions 651 and 652, and beam portions 661, 662, 663, and 664 that connect the support portions 651 and 652 to the base portion 61. The vibration substrate 6 is fixed to the base 91 (not shown) by the support portions 651 and 652.

A drive signal electrode and a drive ground electrode which are not shown are disposed on the drive arms 641 to 644. Therefore, when a drive signal is applied between these electrodes, the drive arms 641 to 644 flexurally vibrate in a direction (X-axis direction) shown by arrow A shown in FIG. 9A (this inherent vibration mode is a main vibration). On the other hand, a detection signal electrode and a detection ground electrode are disposed on the detection arms 621 and 622. When an angular velocity around the Z-axis is applied, as shown in FIG. 9A, in a state where the drive arms 641 to 644 are vibrated, a vibration in a direction shown by arrow B is excited, as shown in FIG. 9B, by the action of a Coriolis force on the drive arms 641 to 644, the detection arms 621 and 622 flexurally vibrate in a direction shown by arrow C so as to act in concert with this vibration. Electric charge generated in the detection arms 621 and 622 by such a vibration is extracted as a detection signal from between the detection signal electrode and the detection ground electrode, and an angular velocity is obtained on the basis of this detection signal.

In the third embodiment described above, it is also possible to exhibit the same effect as that in the aforementioned first embodiment.

Fourth Embodiment

Next, a vibrator according to a fourth embodiment of the invention will be described.

Figure 10:
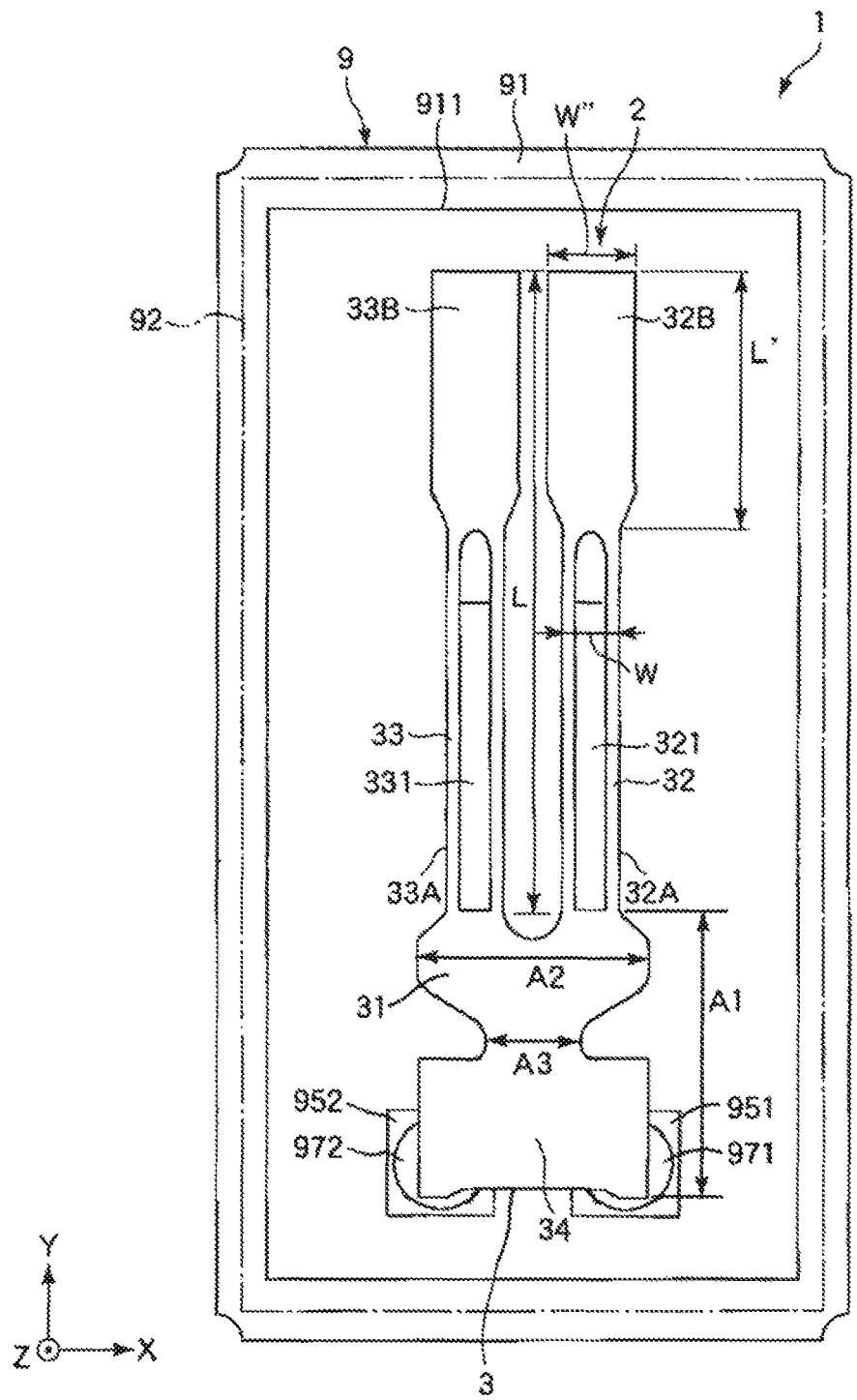
FIG. 10 is a plan view illustrating a vibrator according to a fourth embodiment of the invention.
Figure 11:
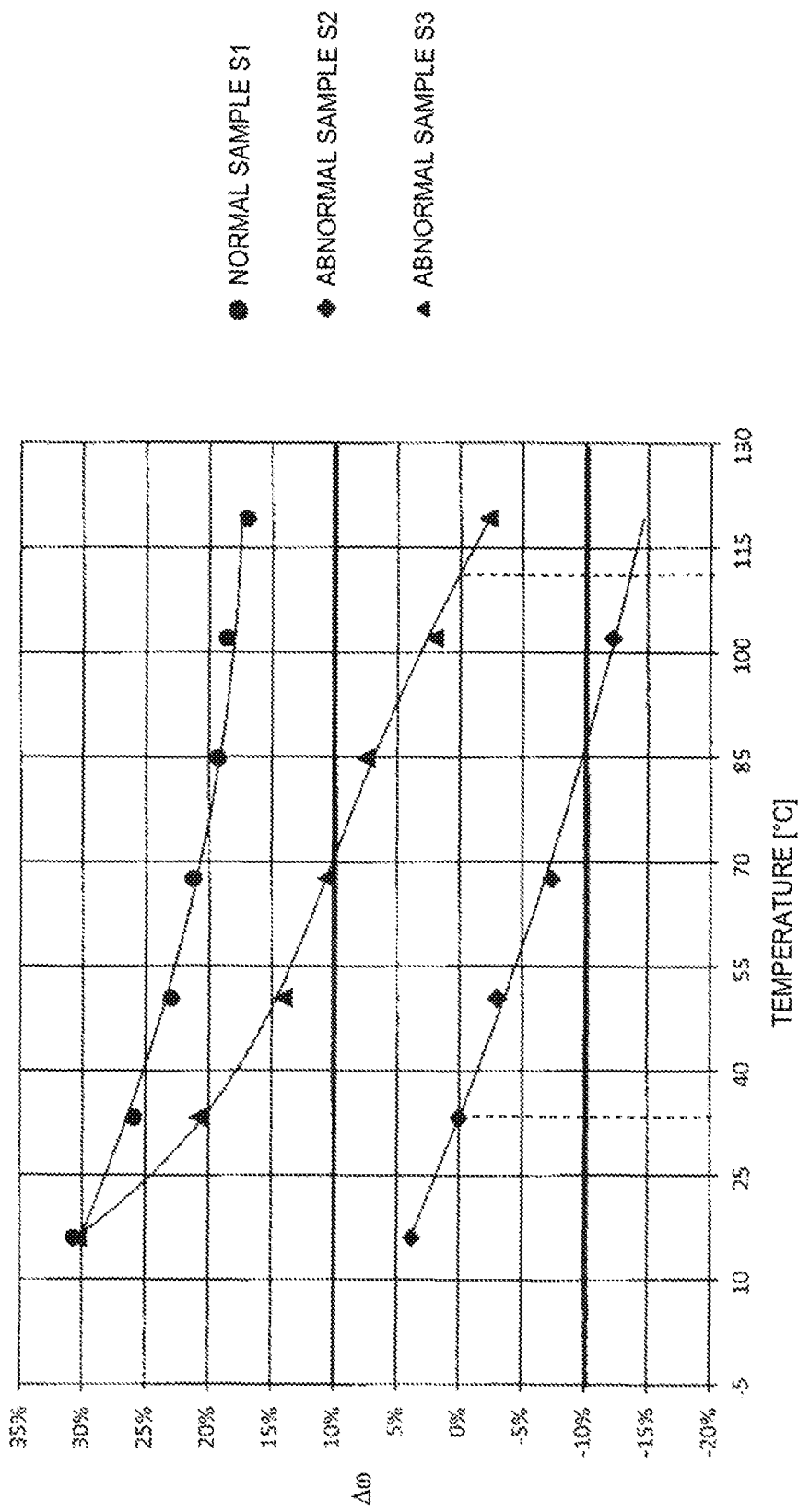
FIG. 11 is a graph illustrating a relationship between Δω and a temperature.
Figure 12:
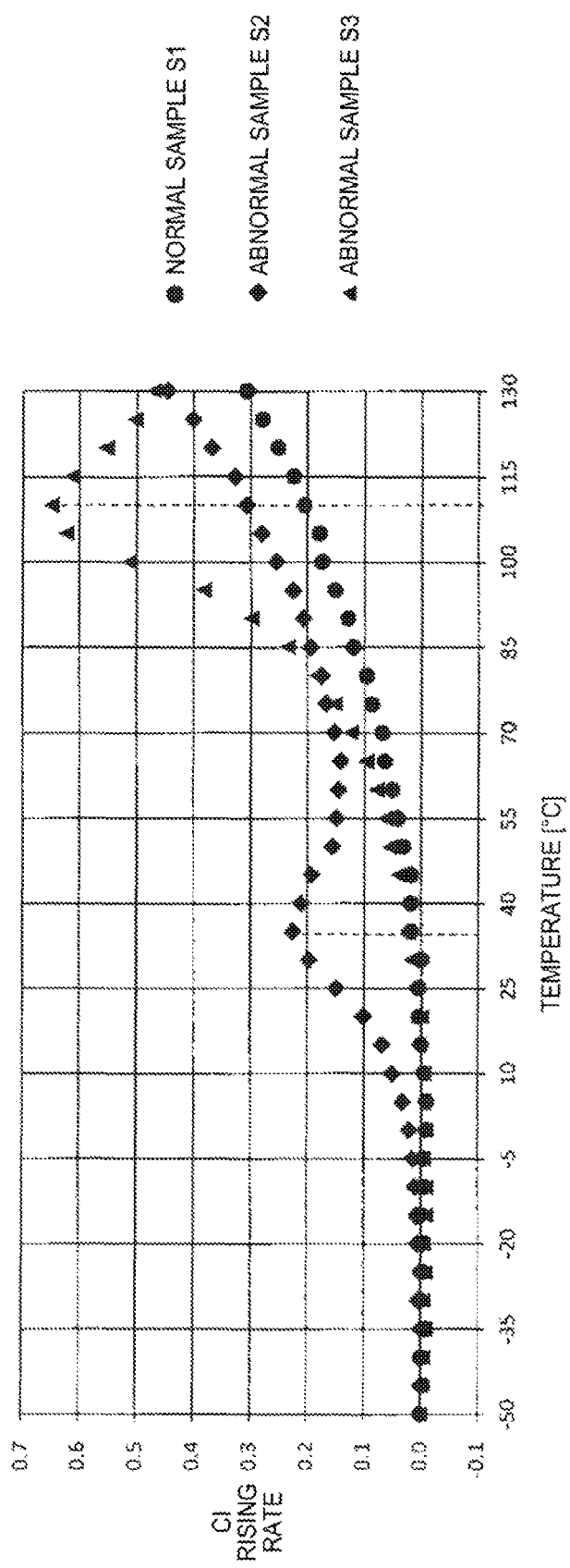
FIG. 12 is a graph illustrating a relationship between a CI rising rate and a temperature.
Figure 13:
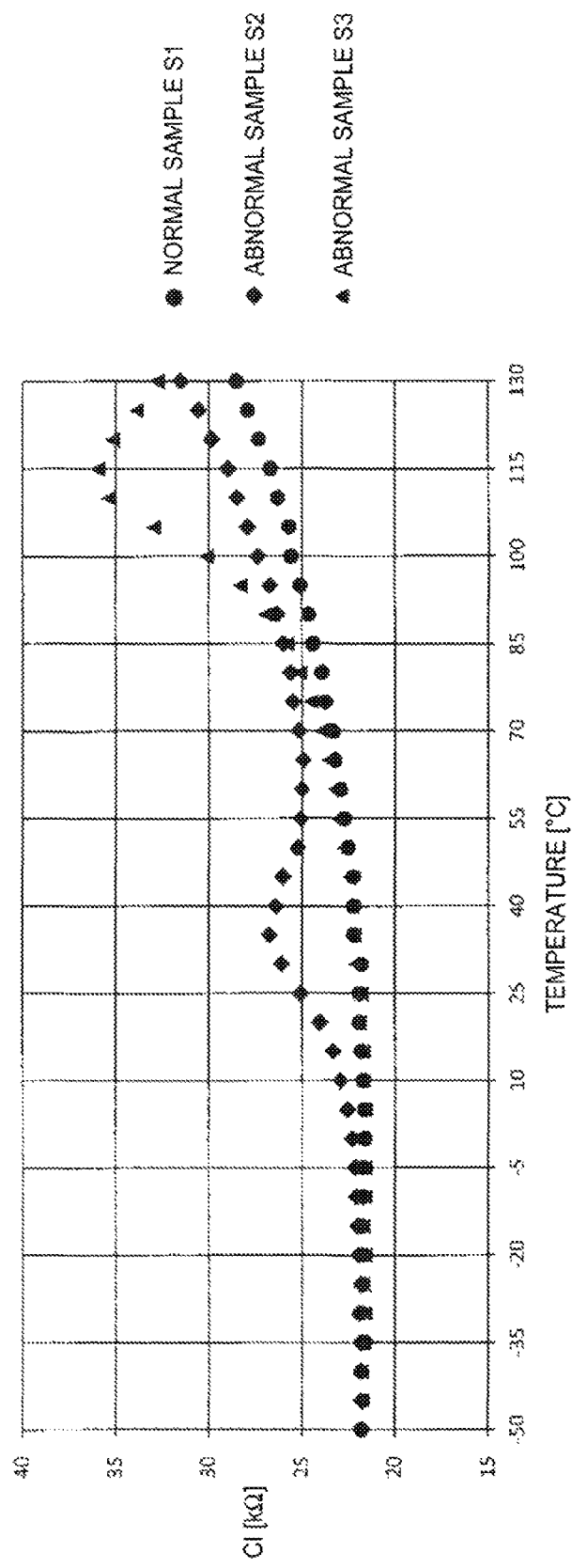
FIG. 13 is a graph illustrating a relationship between CI and a temperature.
Figure 14:
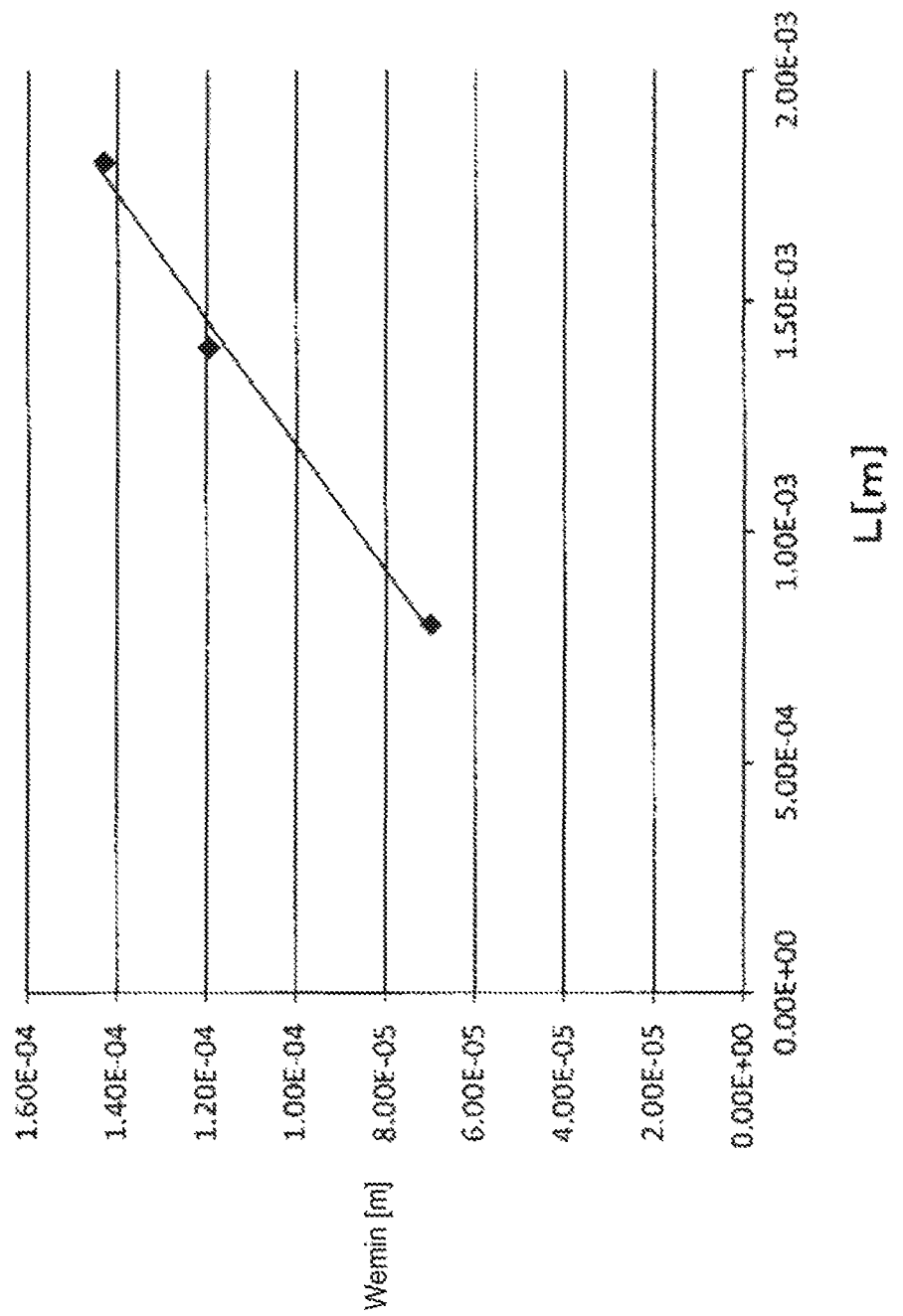
FIG. 14 is a graph illustrating a relationship between the length of a vibrating arm and the width of the vibrating arm.

FIG. 10 is a plan view illustrating a vibrator according to the fourth embodiment of the invention. FIG. 11 is a graph illustrating a relationship between $\Delta\omega$ and a temperature. FIG. 12 is a graph illustrating a relationship between a CI rising rate and a temperature. FIG. 13 is a graph illustrating a relationship between CI and a temperature. FIG. 14 is a graph illustrating a relationship between the length of a vibrating arm and the width of the vibrating arm.

Hereinafter, the vibrator of the fourth embodiment will be described with a focus on differences from the aforementioned first embodiment, and the description of similar particulars will not be given.

The vibrator according to the fourth embodiment of the invention is the same as that of the aforementioned first embodiment, except for a difference in the configuration of the vibrator element. Meanwhile, the same components as those of the aforementioned first embodiment are denoted by the same reference numerals and signs.

As shown in FIG. 10, the vibrator element 2 including the vibrator 1 of the present embodiment has a configuration in which the support arms 341 and 342 are omitted from the configuration of the aforementioned first embodiment. In addition, the tip portion of each of the groove portions 321, 322, 331, and 332 is formed in a round shape. The vibrator element 2 having such a configuration also uses the X-axis reverse-phase mode as a main vibration.

As is the case with the aforementioned first embodiment, in such a vibrator 1, Expressions (1) and (2) are also satisfied. Hereinafter, an effect (effect which is not described in the aforementioned first embodiment) due to satisfying Expression (2) will be described using actual measured values. Meanwhile, the size of the vibrator element 2 used in measurement is configured such that the thickness of the vibration substrate 3 is 120 μm, the length L of the vibrating arms 32 and 33 is 1,618 μm, the length L' of the weight portions 32B and 33B is 723 μm, the width W of the arms 32A and 33A is 134 μm, the width W" of the weight portions 32B and 33B is 185 μm, the length A1 of a portion located closer to the base end side than the vibrating arms 32 and 33 is 581 μm, the width A2 of the base portion 31 is 499 μm, and the width A3 of a connecting portion (constriction portion) located between the base portion 31 and the support portion 34 is 146 μm. In addition, an adhesive of bismaleimides, Young's modulus=3.4 GPa, Poisson's ratio=0.33, and mass density=4070 kg/m$^3$ has been used as the conductive adhesives 971 and 972 for fixing the vibrator element 2 to the base 91. In addition, the measurement of the resonance frequencies $\omega_1$ and $\omega_2$ has been performed using heterodyne interferometry in a state where the lid 92 is not sealed.

FIG. 11 is a graph illustrating a relationship between an environmental temperature and $\Delta\omega$ relating to a normal sample S1 and two abnormal samples S2 and S3. Herein, $\Delta\omega$ is equivalent to Expression (16), the resonance frequency of the X-axis reverse-phase mode which is a main vibration mode is set to $\omega_1$ (=32.768 kHz), and the resonance frequency of the Z-axis in-phase mode which is an unnecessary vibration mode considered to internally resonate with the main vibration is set to $\omega_2$. That is, $\Delta\omega$ herein may also be referred to a value showing how much $\omega_2$ shifts from 65.536 kHz (frequency twice as high as $\omega_1$).

On the other hand, FIG. 12 is a graph illustrating a relationship between an environmental temperature and a CI rising rate relating to the normal sample S1 and the two abnormal samples S2 and S3, and FIG. 13 is a graph illustrating a relationship between an environmental temperature and CI relating to the normal sample S1 and the two abnormal samples S2 and S3. FIGS. 12 and 13 are graphs showing how much the CI rising rate (CI value) changes from a reference (0), using the CI value at −50° as the reference. As shown in FIGS. 12 and 13, the CI rising rate (CI value) rises gently in the normal sample S1, whereas the CI rising rate (CI value) rises abnormally in the vicinity of 35° C. in the abnormal sample S2, and the CI rising rate (CI value) rises abnormally in the vicinity of 110° C. in the abnormal sample S3. As to the abnormal samples S2 and S3, a temperature at which the CI rising rate (CI value) rises abnormally is substantially coincident with a temperature at which $\Delta\omega$ shown in FIG. 11 is set to 0%. Therefore, it can be understood that an abnormal rise in such a CI rising rate (CI value) can be reduced by satisfying the relation of Expression (2) (that is, by excluding the vicinity of $\Delta\omega$=0%). Meanwhile, in the vibrator element 2, when Expression (2) is satisfied in any temperature region of an operating temperature range (−40° C. to 85° C., −40° C. to 150° C., or the like), it is possible to reduce a concern of the above-mentioned abnormal rise in the CI value occurring by using the temperature region. Preferably, when Expression (2) is satisfied at all the temperatures in the operating temperature range, it is possible to reduce a concern of the above-mentioned abnormal rise in the CI value occurring at the entirety of the operating temperature range.

Meanwhile, there is slightly more deterioration occurring than in a case where the relation of Expression (2) is satisfied, but it is also possible to exhibit the same effect in a case where the relation of $|\Delta\omega|\leq 0.05$ is satisfied.

In addition, in the vibrator 1 of the present embodiment, Q of the vibrator 1 satisfies the relation of the following Expression (31), f0max of Expression (31) satisfies the relation of the following Expression (32), and Wemin of Expression (32) satisfies the relation of the following Expression (33).

$$Q \geq \frac{\rho C_p}{c\alpha^2 \Theta} \times \frac{1 + \left(\frac{f}{f0_{max}}\right)^2}{\frac{f}{f0_{max}}} \quad (31)$$

$$f0_{max} = \frac{\pi k}{2\rho C_p W_{emin}^2} \quad (32)$$

$$W_{emin} = C(AL + B) \quad (33)$$

In Expressions (31), (32), and (33), $A=7.3690\times10^{-2}$, $B=1.2544\times10^{-5}$, $C=1.1$ to $1.3$, and f0max [Hz] are resonance frequencies (thermal relaxation frequency) at which a thermoelastic loss is maximized when the equivalent arm width We of the vibrating arms 32 and 33 is a minimum value Wemin, described later, in a case where the cross-sectional shapes of the vibrating arms 32 and 33 (arms 32A and 33A) are replaced by rectangular shapes so that thermoelastic losses become equal to each other, L [m] is the length of the vibrating arms 32 and 33 in an extending direction, $\rho$ [kg/m$^3$] is the mass density of the vibrating arms 32 and 33, Cp [J/(kg·K)] is the heat capacity of the vibrating arms 32 and 33, c [N/m$^2$] is the elastic constant of the vibrating arms 32 and 33 in the extending direction, $\alpha$[1/K] is the coefficient of thermal expansion of the vibrating arms 32 and 33 in the extending direction, $\Theta$ [K] is the environmental temperature, k[W/(m·k)] is the thermal conductivity of the vibrating arms 32 and 33 in a width direction, and $\pi$ is the ratio of the circumference of a circle to its diameter.

Hereinafter, a method of deriving Expression (31) will be described. First, the following Table 1 shows a relationship between the length L of the vibrating arms 32 and 33 considered to be effective in order to achieve a reduction in size, and the minimum value Qmin of the Q value which is obtained in a case of the length. To satisfy such a relationship is to obtain the vibrator element 2 which is small in size and has a high Q value. By obtaining such a vibrator element 2, the vibrator element 2 having a high Q value makes it possible to reduce the power consumption of an oscillation circuit using this, and to reduce the emission of $CO_2$ generated during manufacturing due to a reduction in size, and thus it is possible to obtain a vibrator having a small environmental load.

TABLE 1

| L[m] | Qmin |
|---|---|
| $1.8 \times 10^{-3}$ | 50000 |
| $1.4 \times 10^{-3}$ | 35000 |
| $8.0 \times 10^{-4}$ | 12000 |

The minimum value Wemin with respect to the length L is calculated by substituting f=32.768 kHz and Qmin, as $Q_{TED}$ (Q value considering only a thermoelastic loss), into the following Expressions (34) and (35), and calculating the width W satisfying the relation of f>f0. The calculation results of this minimum value Wemin are shown in the following Table 3. Meanwhile, each numerical value in Expressions (34) and (35) is as shown in the following Table 2. In addition, f0 is a thermal relaxation frequency, and f>f0 means that the vibrator element 2 is present in an adiabatic region.

TABLE 2

| Material | k [N/(K·s)] | Cp [J/(kg·K)] | $\rho$ [kg/m$^3$] | $\alpha$ [K$^{-1}$] | c [N/m$^2$] |
|---|---|---|---|---|---|
| Quartz Crystal | 6.65 | 735.3718 | 2649 | $1.37 \times 10^{-5}$ | $8.67 \times 10^{10}$ |

$$Q_{TED} = \frac{\rho C_p}{c\alpha^2 \Theta} \times \frac{1 + \left(\frac{f}{f0}\right)^2}{\frac{f}{f0}} \quad (34)$$

$$f0 = \frac{\pi k}{2\rho C_p W^2} \quad (35)$$

TABLE 3

| L[m] | Qmin | Wemin[m] |
|---|---|---|
| $1.8 \times 10^{-3}$ | 50000 | $1.429 \times 10^{-4}$ |
| $1.4 \times 10^{-3}$ | 35000 | $1.195 \times 10^{-4}$ |
| $8.0 \times 10^{-4}$ | 12000 | $6.996 \times 10^{-5}$ |

The minimum value Wemin with respect to the length L is represented as a graph shown in FIG. 14, and the approximate expression thereof is set to Wemin=$7.3690\times10^{-2}$L+ $1.2544\times10^{-5}$. Further, Expression (33) is obtained by multiplying the right side of this expression by a coefficient C (where, C is 1.1 to 1.3). Using this Expression (33), it is possible to calculate the minimum value Wemin of the width W of the vibrating arms 32 and 33 with respect to the length L of the vibrating arms 32 and 33. Further, f0 can be calculated by substituting the obtained minimum value Wemin into Expression (35). Meanwhile, f0 is a resonance frequency (=f0max) at which a thermoelastic loss is maximized when the width W of the vibrating arms 32 and 33 is the minimum value Wemin. As described above, in the present embodiment, since there is a limitation to an adiabatic region (f>f0), Qmin ($Q_{TED}$) which is the lower limit of the Q value can be determined by f0. That is, Qmin can be calculated by substituting f0 into Expression (34). When the relation of Q≥Qmin is satisfied, a sufficiently high Q value is obtained, and thus Expression (31) is derived.

Meanwhile, for reference, the following Table 4 shows Qmin and Wemin at the length L=$1.8\times10^{-3}$ [m], $1.4\times10^{-3}$ [m], $1.0\times10^{-3}$ [m], and $8.0\times10^{-4}$ [m] of the vibrating arms 32 and 33. In this manner, the length of the vibrating arms 32 and 33 is set to be equal to or less than $1.8\times10^{-3}$ [m], and thus it is possible to sufficiently reduce the size of the vibrator element 2.

TABLE 4

| f [kHz] | L [m] | Wemin [m] | $\Theta$ [K] | f0max [Hz] | Qmin |
|---|---|---|---|---|---|
| 32.768 | $1.8 \times 10^{-3}$ | $1.597 \times 10^{-4}$ | 298.15 | 210.2 | 62461 |
| 32.768 | $1.4 \times 10^{-3}$ | $1.273 \times 10^{-4}$ | 298.15 | 331.0 | 39676 |
| 32.768 | $1.0 \times 10^{-3}$ | $9.486 \times 10^{-5}$ | 298.15 | 596.0 | 22042 |
| 32.768 | $8.0 \times 10^{-4}$ | $7.865 \times 10^{-5}$ | 298.15 | 867.0 | 15157 |
| 35.000 | $8.0 \times 10^{-4}$ | $7.865 \times 10^{-5}$ | 298.15 | 867.0 | 16188 |

As stated above, the vibrator 1 of the present embodiment has been described, but the resonance frequency of the main vibration of the vibrator element 2 is not limited to 32.768 kHz (32.768±1 kHz), and may be, for example, any of two times, four times, eight times and sixteen times 32.768±1 kHz. According to such a frequency, it is possible to relatively simply obtain a signal of 32.768 kHz by frequency dividing.

Fifth Embodiment

Next, an oscillator according to a fifth embodiment of the invention will be described.

Figure 15:
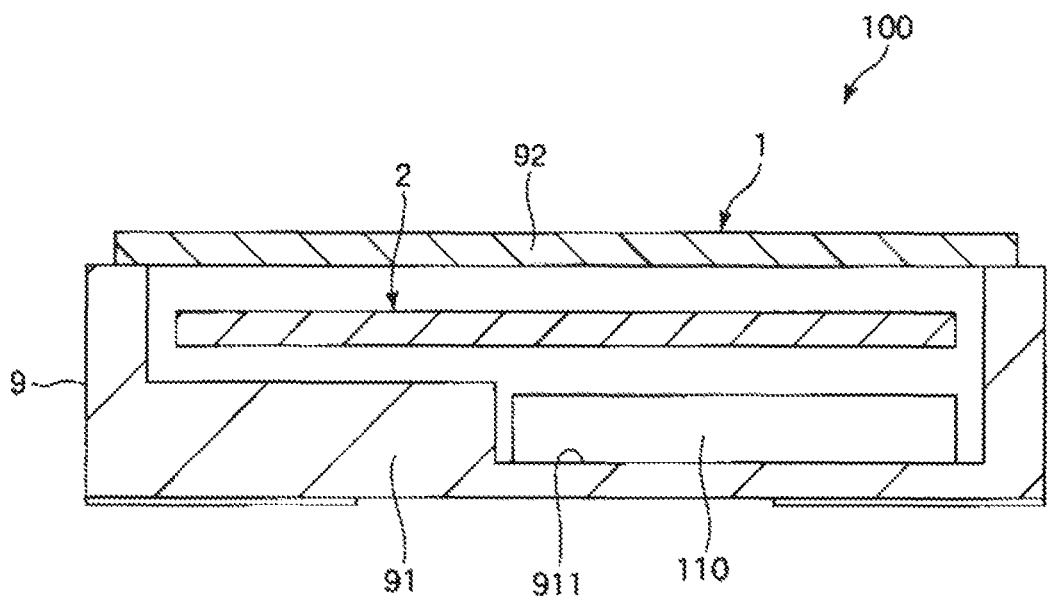
FIG. 15 is a cross-sectional view illustrating an oscillator according to a fifth embodiment of the invention.

FIG. 15 is a cross-sectional view illustrating an oscillator according to the fifth embodiment of the invention.

An oscillator 100 shown in FIG. 15 includes the vibrator 1 and an IC chip 110 for driving the vibrator element 2. Hereinafter, the oscillator 100 will be described with a focus on differences from the above-described vibrator 1, and the description of similar particulars will not be given.

In the oscillator 100, the IC chip 110 is fixed to the concave portion 911 of the base 91. In addition, although not shown in the drawing, the IC chip 110 is electrically connected to an internal terminal and an external terminal. In addition, the IC chip 110 includes an oscillation circuit 111. Therefore, when the vibrator element 2 is driven by a drive signal from the IC chip 110, it is possible to extract a signal having a predetermined frequency through the external terminal. Since such an oscillator 100 has the vibrator 1 built-in, high reliability is obtained.

Sixth Embodiment

Next, a real-time clock according to a sixth embodiment of the invention will be described.

Figure 16:
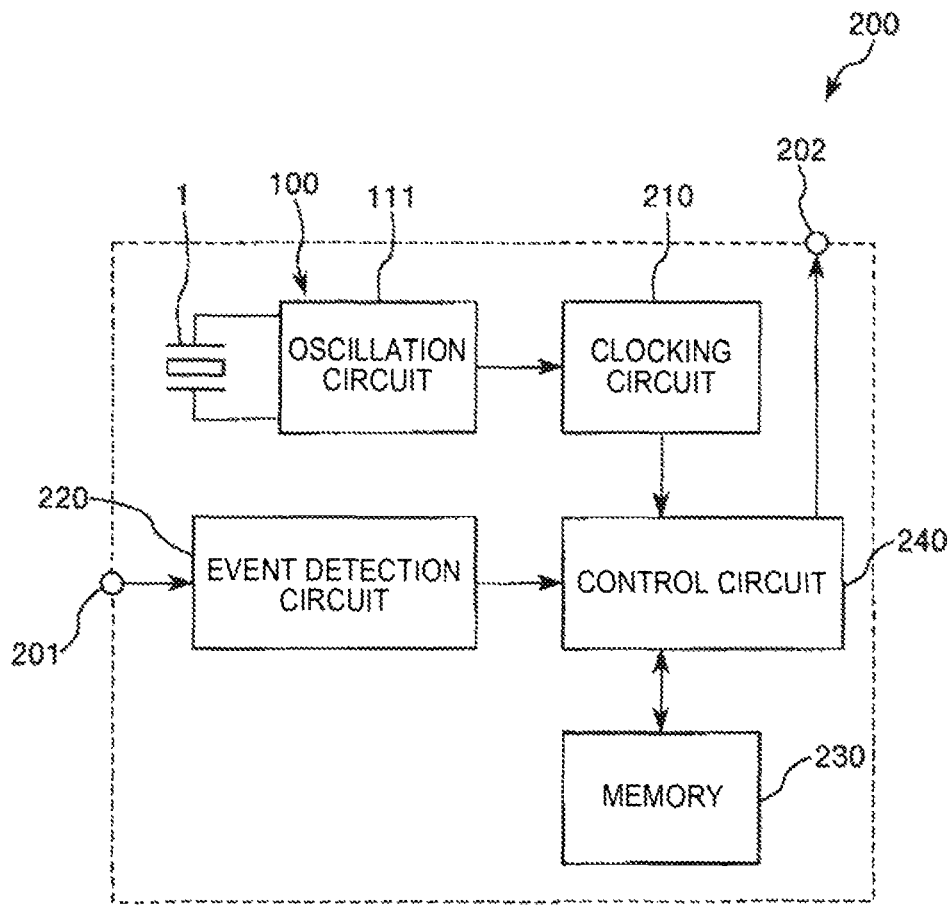
FIG. 16 is a functional block diagram of a real-time clock according to a sixth embodiment of the invention.

FIG. 16 is a functional block diagram illustrating a real-time clock according to the sixth embodiment of the invention.

As shown in FIG. 16, a real-time clock 200 includes the oscillator 100, a clocking circuit 210, an event detection circuit 220, a memory 230, and a control circuit 240. As described above, the oscillator 100 includes the vibrator element 2 and the oscillation circuit 111 which is electrically connected to the vibrator element 2, and the vibrator element 2 vibrates at a predetermined frequency by a drive signal being input through the oscillation circuit 111. The oscillation circuit 111 amplifies and outputs a signal which is output from the vibrator element 2.

The oscillator 100 is connected to the clocking circuit 210, and when a signal which is output from the oscillator 100 is frequency-divided to obtain a frequency of 1 [Hz], clocking of a year, a month, a day, an hour, a minute and a second is performed by each clocking register (not shown) using the signal of 1 [Hz]. That is, the clocking circuit 210 generates date and time data on the basis of a signal which is output from the oscillation circuit 111 of the oscillator 100. With such a clocking circuit 210, it is possible to obtain time data, and to record the date and time or the like during the occurrence of an event (for each event detection period) in the memory 230. Meanwhile, the clocking circuit 210 can also store data regarding a day of the week through setting, in addition to a year, a month, a day, an hour, a minute and a second stated above.

The event detection circuit 220 is connected to an event input terminal 201 which is an external terminal of the real-time clock 200. The event detection circuit 220 is configured to set an event occurrence flag when an electrical signal indicating the occurrence of an event is input to the event input terminal 201. In this manner, the occurrence of an event is indicated by a flag, and thus it is possible to determine the presence or absence of an event on the basis of the flag.

The memory 230 is a storage unit that records data relating to the time data and the event occurrence described above.

The clocking circuit 210, the event detection circuit 220, the memory 230, described above, and an interruption output terminal 202 as an external terminal are connected to the control circuit 240. The control circuit 240 is configured to be capable of reading out the time data, in which it is detected that the flag is set, from the clocking circuit 210, on the basis of flag information which is input from the event detection circuit 220.

Meanwhile, during the occurrence of any event input, the interruption output terminal 202 plays a role in storing the data relating to the time data and the event occurrence, and in simultaneously causing a CPU to perform interruption output on a signal.

Since such a real-time clock 200 has the vibrator 1 built-in, high reliability is obtained.

Seventh Embodiment

Next, an electronic device according to a seventh embodiment of the invention will be described.

Figure 17:
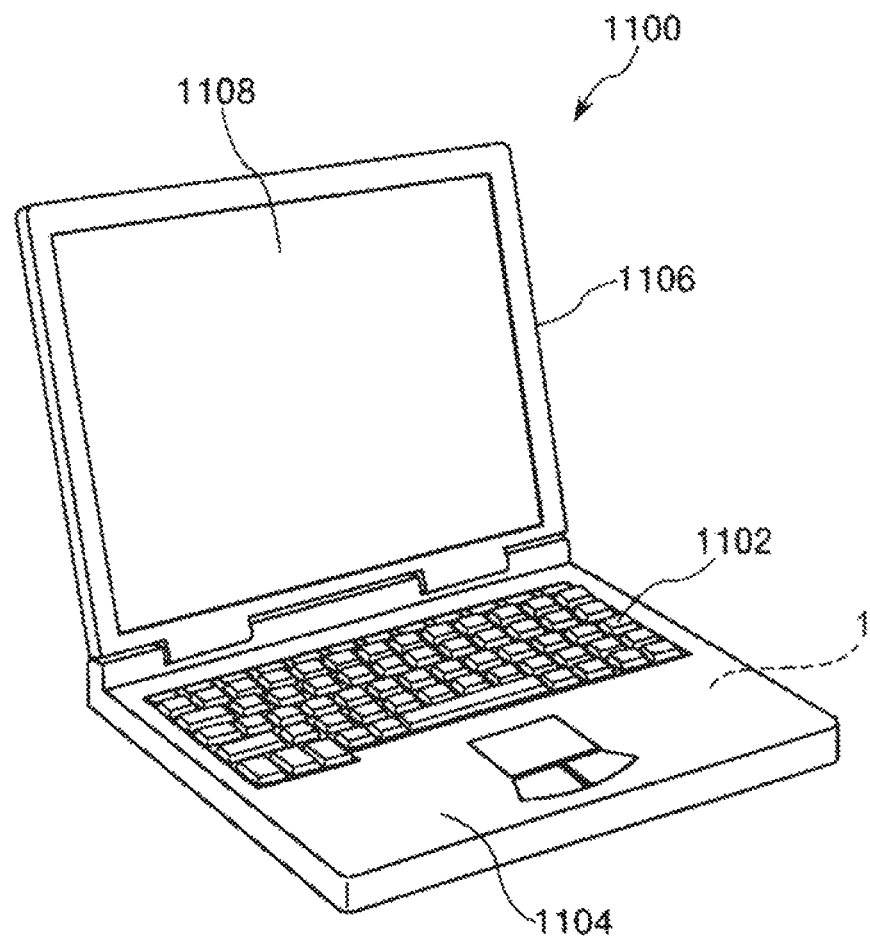
FIG. 17 is a perspective view illustrating a personal computer as an electronic device.

FIG. 17 is a perspective view illustrating a personal computer as an electronic device.

As shown in FIG. 17, a personal computer (mobile-type personal computer) 1100 as an electronic device is constituted by a main body 1104 including a keyboard 1102 and a display unit 1106 including a display portion 1108, and the display unit 1106 is rotatably supported with respect to the main body 1104 through a hinge structure. Such a personal computer 1100 has, for example, the vibrator 1 built-in which is used as an oscillator. Therefore, the personal computer 1100 having high reliability is obtained.

Figure 18:
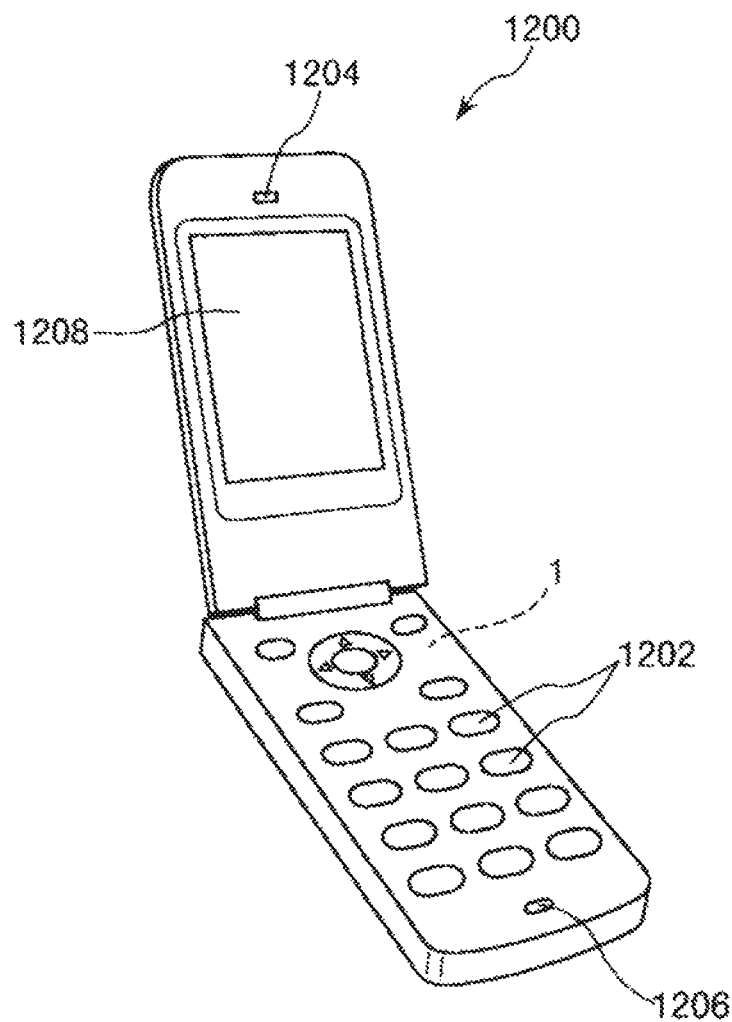
FIG. 18 is a perspective view illustrating a cellular phone as an electronic device.

FIG. 18 is a perspective view illustrating a cellular phone as an electronic device.

As shown in FIG. 18, a cellular phone 1200 (including a smartphone, a PHS or the like) as an electronic device includes a plurality of operation button 1202, an ear piece 1204 and a mouth piece 1206, and has a display portion 1208 disposed between the operation button 1202 and the ear piece 1204. Such a cellular phone 1200 has, for example, the vibrator 1 used as an oscillator built-in. Therefore, the cellular phone 1200 having high reliability is obtained.

Figure 19:
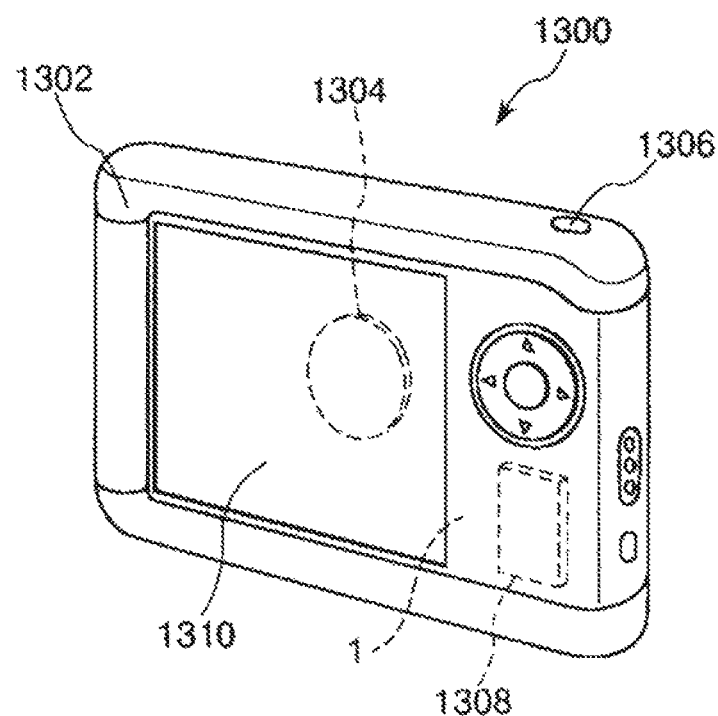
FIG. 19 is a perspective view illustrating a digital still camera as an electronic device.

FIG. 19 is a perspective view illustrating a digital still camera as an electronic device.

As shown in FIG. 19, in a digital still camera 1300 as an electronic device, a display portion 1310 is provided on the rear of the case (body) 1302, and is configured to perform a display on the basis of an imaging signal of a CCD. The display portion 1310 functions as a viewfinder for displaying a subject as an electronic image. In addition, a light-receiving unit 1304 including an optical lens (imaging optical system), a CCD and the like is provided on the front side (back side in the drawing) of the case 1302. In a case where a photographer confirms a subject image displayed on the display portion 1310 and pushes a shutter button 1306, an imaging signal of the CCD at that point in time is transmitted and stored to and in a memory 1308. Such a digital still camera 1300 has, for example, the vibrator 1 built-in which is used as an oscillator. Therefore, the digital still camera 1300 having high reliability is obtained.

Meanwhile, in addition to the personal computer of FIG. 17, the cellular phone of FIG. 18, and the digital still camera of FIG. 19, the electronic device according to the invention can be applied to, for example, a smartphone, a tablet terminal, a watch, an ink jet ejecting apparatus (for example ink jet printer), a laptop personal computer, a television, a video camera, a video tape recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, medical instrument (for example, electronic thermometer, sphygmomanometer, blood glucose monitoring system, electrocardiogram measurement device, ultrasound diagnostic device, and electronic endoscope), a fish finder, various types of measuring apparatuses, meters and gauges (for example, meters and gauges of a vehicle, an airplane, and a ship), a flight simulator, and the like.

Eighth Embodiment

Next, a moving object according to an eighth embodiment of the invention will be described.

Figure 20:
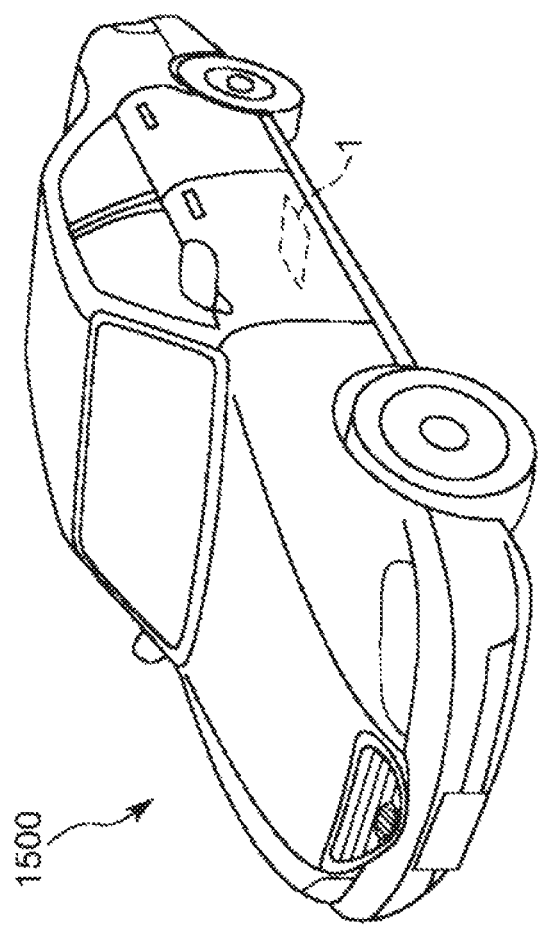
FIG. 20 is a perspective view illustrating an automobile as a moving object.

FIG. 20 is a perspective view illustrating an automobile as a moving object.

As shown in FIG. 20, an automobile 1500 as a moving object has the vibrator 1 mounted thereto. The vibrator 1 can be applied widely to electronic control units (ECUs) such as a keyless entry, an immobilizer, a car navigation system, a car air conditioner, an antilock brake system (ABS), an air bag, a tire pressure monitoring system (TPMS), an engine controller, a battery monitor of a hybrid automobile or an electric automobile, and a car-body posture control system. In this manner, the automobile 1500 has the vibrator 1 built-in, and thus the automobile 1500 having high reliability is obtained.

As stated above, the vibrator, the oscillator, the real-time clock, the electronic device and the moving object according to the invention have been described on the basis of the shown embodiments, but the invention is not limited thereto, and the configuration of each portion can be replaced by any configuration having the same function. In addition, any other configurations may be added to the invention. In addition, the respective embodiment described above may be appropriately combined.

In addition, in the above-described embodiment, the vibration substrate 3 is formed of a quartz crystal, but the configuration material of the vibration substrate 3 is not limited to a quartz crystal, and examples of the substrate capable of being used include a substrate of aluminum nitride (AlN), a substrate of an oxide such as lithium niobate (LiNbO$_3$), lithium tantalate (LiTaO$_3$), lead zirconate titanate (PZT), lithium tetraborate (Li$_2$B$_4$O$_7$), langasite crystal (La$_3$Ga$_5$SiO$_{14}$), potassium niobate (KNbO$_3$), gallium phosphate (GaPO$_4$), gallium arsenide (GaAs), aluminum nitride (AlN), zinc oxide (ZnO, Zn$_2$O$_3$), barium titanate (BaTiO$_3$), lead titanate (PbPO$_3$), sodium potassium niobate ((K, Na)NbO$_3$), bismuth ferrite (BiFeO$_3$), sodium niobate (NaNbO$_3$), bismuth titanate (Bi$_4$Ti$_3$O$_{12}$), or bismuth sodium titanate (Na$_{0.5}$Bi$_{0.5}$TiO$_3$), a laminated piezoelectric substrate configured by laminating a piezoelectric material such as aluminum nitride or tantalum pentoxide (Ta$_2$O$_5$) on a glass substrate, a substrate of piezoelectric ceramics, or the like.

In addition, in the above-described embodiment, the vibrator element is formed by disposing the electrodes on the vibration substrate formed of a quartz crystal, but the vibrator element is not limited thereto, and may be configured to vibrate the vibration substrate by disposing a piezoelectric element (piezo element) on a substrate formed of a non-piezoelectric material as in, for example, a silicon substrate (silicon single crystal (Si), polycrystalline silicon (polysilicon), or non-crystalline silicon (amorphous silicon)), and expanding and contracting this piezoelectric element. In addition, besides, a vibrator element of an electrostatic drive type using an electrostatic force, a Lorentz drive type using a magnetic force, or the like may be used.

The entire disclosure to Japanese Patent Application Nos: 2015-091592, filed Apr. 28, 2015 and 2015-233769, filed Nov. 30, 2015 are expressly incorporated by reference herein.

What is claimed is:

1. A vibrator comprising:
a vibrator element including a base portion and a pair of vibrating arms which are coupled to the base portion; and
a base on which the vibrator element is installed,
wherein when n is set to one of natural numbers equal to or greater than 2, and j is set to a natural number equal to or greater than 1 and equal to or less than n,
the vibrator element vibrates in the n inherent vibration modes having resonance frequencies different from each other,
when a resonance frequency of a main vibration of the vibrator element in the n inherent vibration modes is set to $\omega_1$ in a relationship between an arbitrary integer $k_j$ and a resonance frequency $\omega_j$ corresponding to each of the n inherent vibration modes,
following two expressions are satisfied:

$$\Delta\omega \equiv \left(\frac{\sum_{j=2}^{n} k_j \omega_j}{-k_1} - \omega_1\right) \bigg/ \omega_1 \text{ and } |\Delta\omega| \geq 0.1,$$

the arbitrary integer $k_j$ satisfies a relation between the following two expressions:

$$3 \leq \sum_{j=1}^{n} |k_j| \leq 10 \text{ and } n \leq \sum_{j=1}^{n} |k_j|.$$

2. The vibrator according to claim 1, wherein
when the vibration frequency of the main vibration is set to f [Hz], a relation of $1\times10^3$ [Hz]$\leq$f$<1\times10^6$ [Hz] is satisfied,
Q of the vibrator satisfies a relation of the following expression:

$$Q \geq \frac{\rho C_p}{c\alpha^2 \Theta} \times \frac{1 + \left(\frac{f}{f0_{max}}\right)^2}{\frac{f}{f0_{max}}},$$

in the expression, $$f0_{max} = \frac{\pi k}{2\rho C_p W_{emin}^2},$$

$$W_{emin} = C(AL + B)$$

A=7.3690×10$^{-2}$,
B=1.2544×10$^{-5}$,
C=1.1 to 1.3,
L [m] is a length of the vibrating arm in an extending direction,
p [kg/m$^3$] is a mass density of the vibrating arm,
Cp [J/(kg·K)] is a heat capacity of the vibrating arm,
c [N/m$^2$] is an elastic constant of the vibrating arm in the extending direction,
a [1/K] is a coefficient of thermal expansion of the vibrating arm in the extending direction,
Θ [K] is an environmental temperature,
k [W/(m·k)] is a thermal conductivity of the vibrating arm in a width direction, and
π is a ratio of the circumference of a circle to its diameter.

3. The vibrator according to claim 1, wherein a relation of the following expression is satisfied:

$$3 \le \sum_{j=1}^{n} |k_j| \le 6.$$

4. The vibrator according to claim 3, wherein a relation of the following expression is satisfied:

$$3 \le \sum_{j=1}^{n} |k_j| \le 4.$$

5. The vibrator according to claim 1, wherein the inherent mode includes at least two of:
a first direction reverse-phase mode in which the pair of vibrating arms flexurally vibrate mutually in reverse-phase along a first direction in which the pair of vibrating arms are lined up;
a first direction in-phase mode in which the pair of vibrating arms flexurally vibrate mutually in phase along the first direction;
a third direction reverse-phase mode in which the pair of vibrating arms flexurally vibrate mutually in reverse-phase in a second direction in which the base portion and the vibrating arms are lined up, and a third direction perpendicular to the first direction;
a third direction in-phase mode in which the pair of vibrating arms flexurally vibrate mutually in phase in the third direction;
a twisted reverse-phase mode in which the pair of vibrating arms are twisted mutually in reverse-phase, using a virtual central line along the first direction through a center of a cross section along each vibrating arm in the first direction and the third direction as an axis of rotation;
a twisted in-phase mode in which the pair of vibrating arms are twisted mutually in phase, using the virtual central line as an axis of rotation; and
a high-order mode of the first direction reverse-phase mode, a high-order mode of the first direction in-phase mode, a high-order mode of the third direction reverse-phase mode, a high-order mode of the third direction in-phase mode, a high-order mode of the twisted reverse-phase mode and a high-order mode of the twisted in-phase mode.

6. The vibrator according to claim 5, wherein the main vibration is the first direction reverse-phase mode.

7. The vibrator according to claim 6, wherein the high-order mode includes at least one of second-order modes of the first direction reverse-phase mode, the first direction in-phase mode, the third direction reverse-phase mode, and the third direction in-phase mode.

8. The vibrator according to claim 1, wherein when seen in plan view, the vibrating arm includes:
a weight portion; and
an arm which is disposed between the weight portion and the base portion,
when a length of the arm along a direction in which the base portion and the vibrating arm are lined up is set to L, a relation of L≤0.9 mm is satisfied,
when a thickness of the arm is set to T, the relation of 50 μm≤T≤150 μm is satisfied,
when a width of the arm along a direction in which the pair of vibrating arms are lined up is set to W, a relation of W≤60 μm is satisfied,
when a length of the weight portion along the direction in which the base portion and the vibrating arm are lined up is set to L', a relation of L'/L≤0.5 is satisfied, and
when a width of the weight portion along the direction in which the pair of vibrating arms are lined up is set to W", a relation of L'<W" is satisfied.

9. The vibrator according to claim 1, wherein when seen in plan view, the vibrating arm includes:
a weight portion: and
an arm which is disposed between the weight portion and the base portion,
the vibrating arm is provided with a groove portion on at least one main surface side of a first main surface and a second main surface which have a front-back relationship with each other along a plane including a direction in which the pair of vibrating arms are lined up and a direction in which the base portion and the vibrating arm are lined up, and
when a thickness of the arm is set to T and a depth of the groove portion is set to T', a relation of 0.8 T≤T'≤0.98 T is satisfied.

10. The vibrator according to claim 9, wherein when a width of a portion, along the direction in which the pair of vibrating arms are lined up, which is located between the groove portion and an outer edge of the one main surface of the vibrating arm along the second direction is set to W' when seen in plan view, the relation of W'≤6 μm is satisfied.

11. The vibrator according to claim 2, wherein the vibration frequency f is either 2×(32.768±1) kHz, 4×(32.768±1) kHz, 8×(32.768±1) kHz, or 16× (32.768±1) kHz.

12. An oscillator comprising:
the vibrator according to claim 1; and
an oscillation circuit.

13. An electronic device comprising the vibrator according to claim 1.

* * * * *